(12) United States Patent
Takebuchi et al.

(10) Patent No.: US 7,023,049 B2
(45) Date of Patent: Apr. 4, 2006

(54) SEMICONDUCTOR DEVICE INCLUDING NONVOLATILE MEMORY

(75) Inventors: Masataka Takebuchi, Kanagawa-ken (JP); Fumitaka Arai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 10/745,477

(22) Filed: Dec. 29, 2003

(65) Prior Publication Data

US 2004/0262670 A1 Dec. 30, 2004

(30) Foreign Application Priority Data

Jun. 30, 2003 (JP) .............................. 2003-188889

(51) Int. Cl.
*H01L 29/788* (2006.01)

(52) U.S. Cl. ....................... 257/316; 257/315; 257/326
(58) Field of Classification Search ........ 257/315–316, 257/324, 326
See application file for complete search history.

(56) References Cited

U.S. PATENT DOCUMENTS

| 4,373,249 | A | * | 2/1983 | Kosa et al. .................. 438/258 |
| 4,471,373 | A | * | 9/1984 | Shimizu et al. ............. 257/315 |
| 5,194,924 | A | * | 3/1993 | Komori et al. ............. 257/316 |
| 6,265,739 | B1 | * | 7/2001 | Yaegashi et al. ............ 257/296 |
| 6,420,754 | B1 | * | 7/2002 | Takahashi et al. .......... 257/326 |
| 6,730,973 | B1 | * | 5/2004 | Hibi et al. .................. 257/390 |
| 2001/0049166 | A1 | * | 12/2001 | Peschiaroli et al. ......... 438/202 |
| 2002/0008278 | A1 | | 1/2002 | Mori |

FOREIGN PATENT DOCUMENTS

JP       2002-64157       2/2002

* cited by examiner

*Primary Examiner*—Allan R. Wilson
(74) *Attorney, Agent, or Firm*—Oblon, Spivak, McClelland, Maier & Neustadt, P.C.

(57) ABSTRACT

A semiconductor device including a nonvolatile memory formed on a semiconductor substrate. According to the semiconductor device, a second gate electrode film is used for a gate electrode film of a logic circuit, and for a control gate electrode film of a nonvolatile memory. As the second gate electrode film is formed at a relatively later step in fabrication, subsequent thermal process may be avoided. The gate structure is suitable for miniaturization of the transistor in the logic circuit.

9 Claims, 21 Drawing Sheets

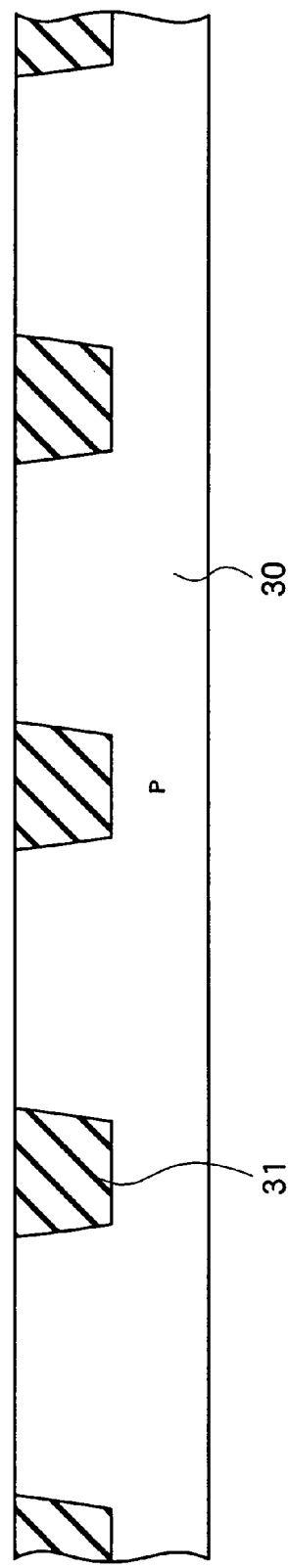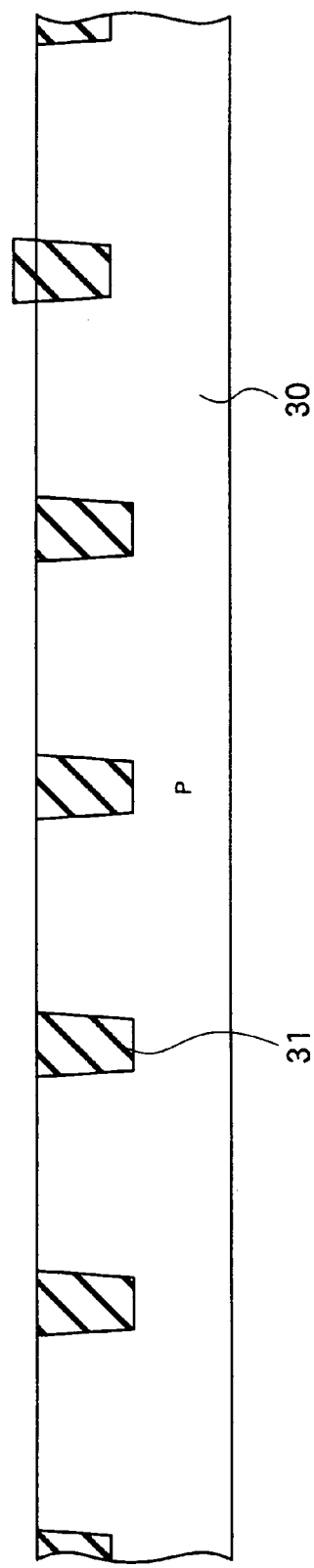
FIG.3A
FIG.3B

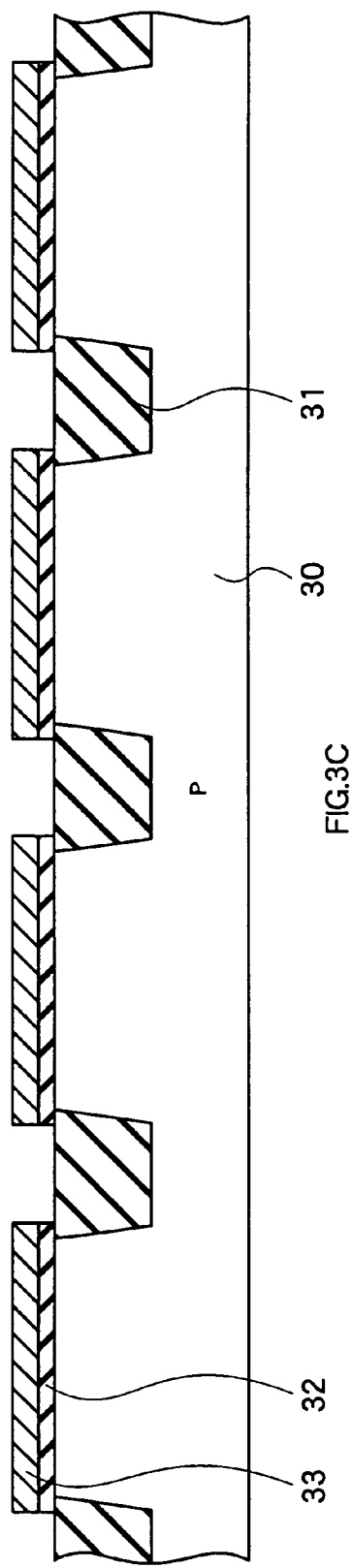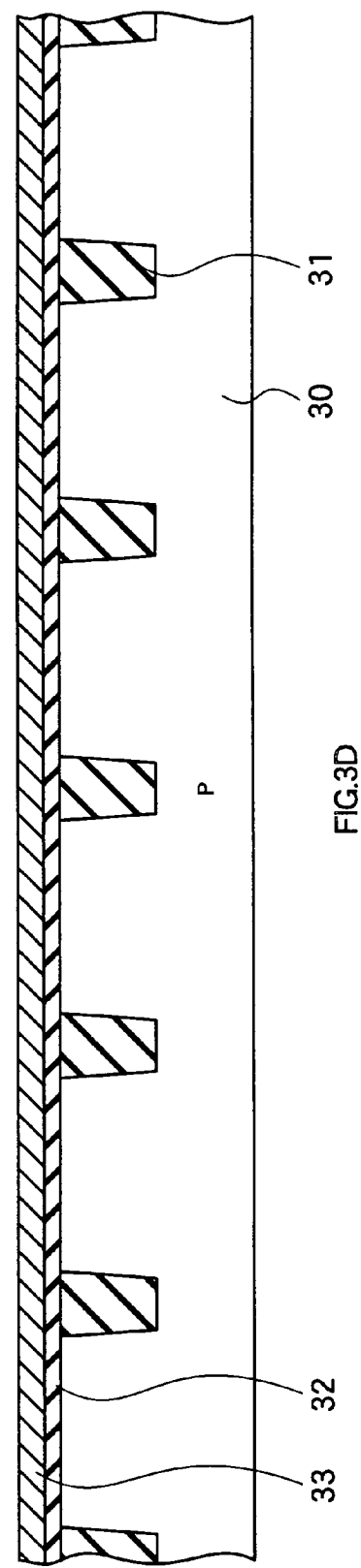

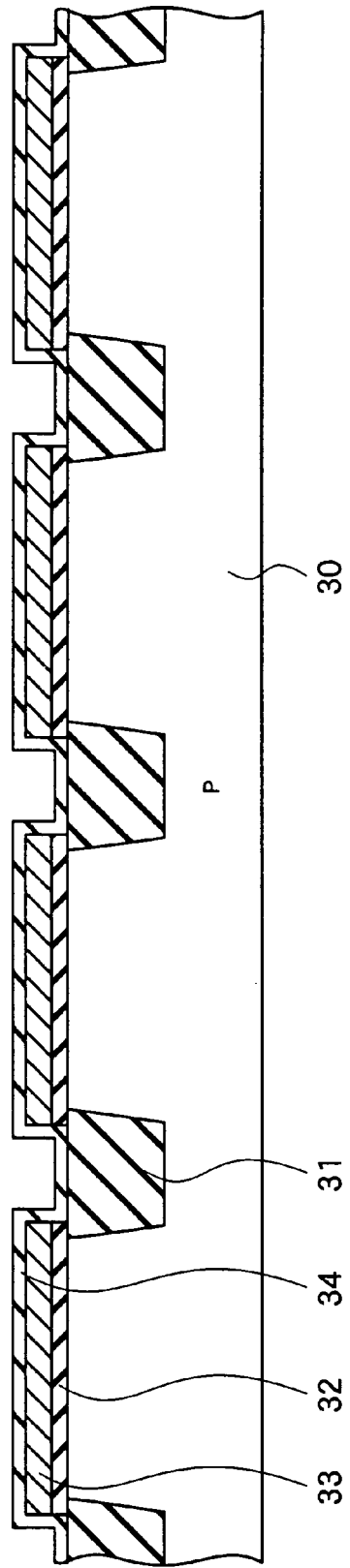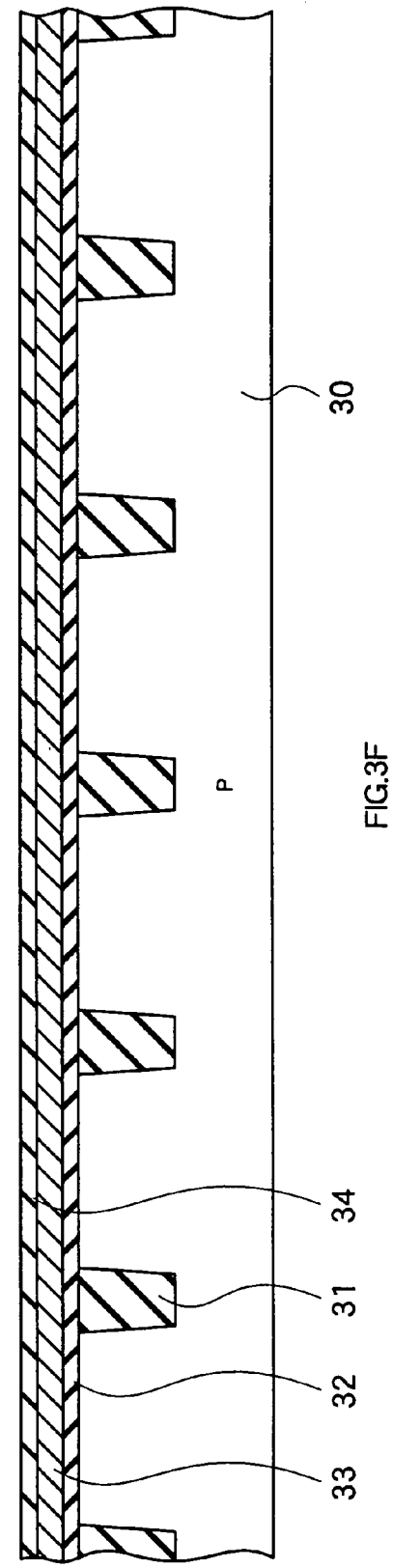

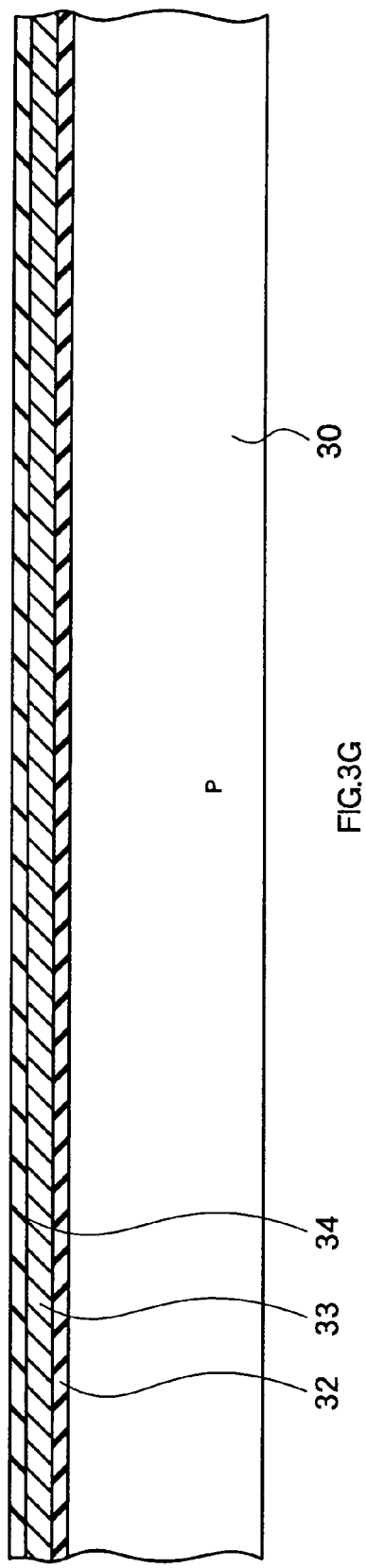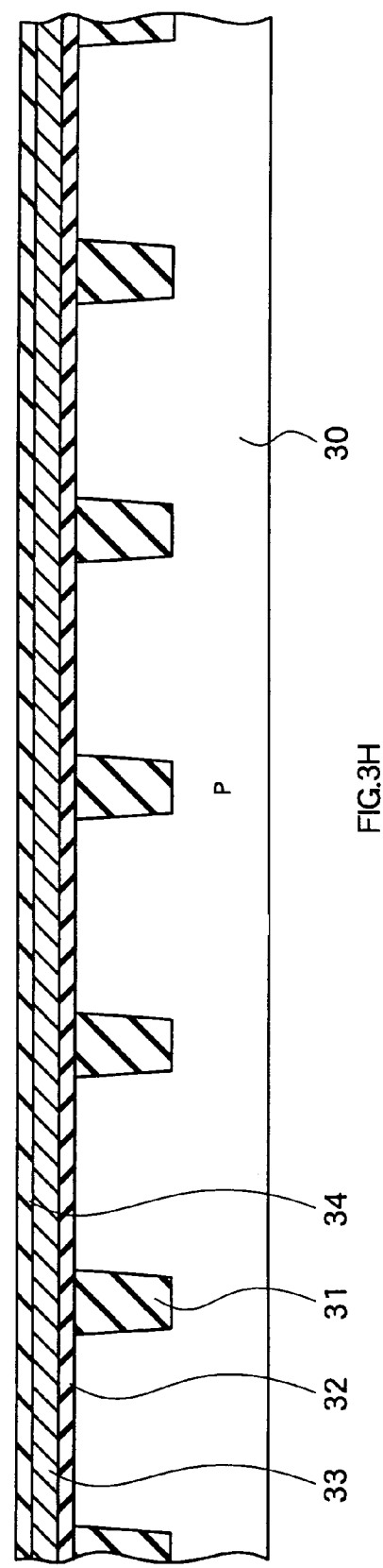

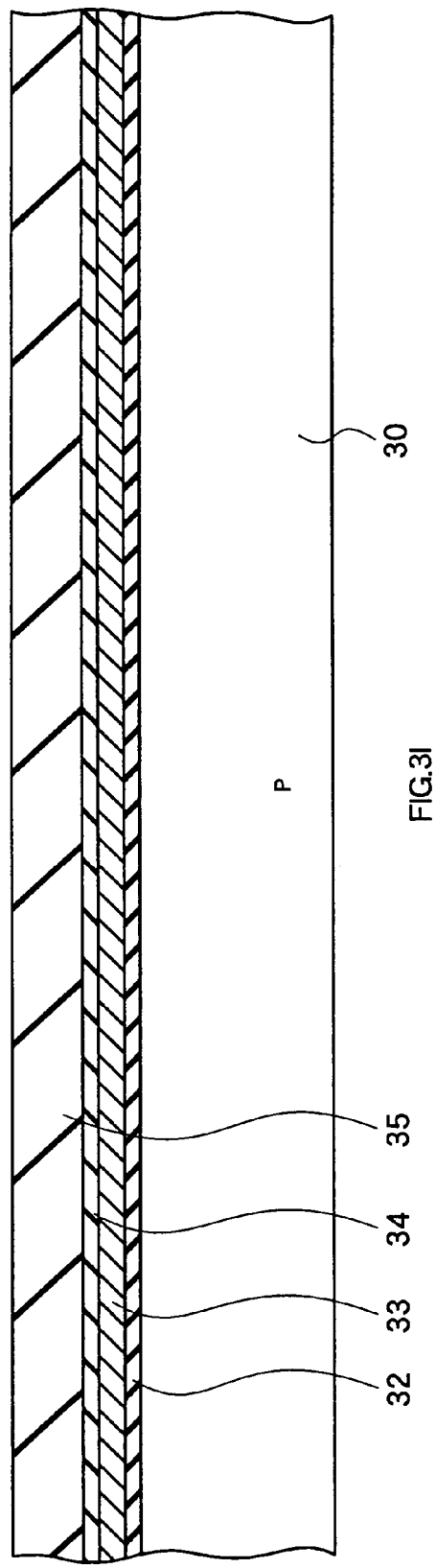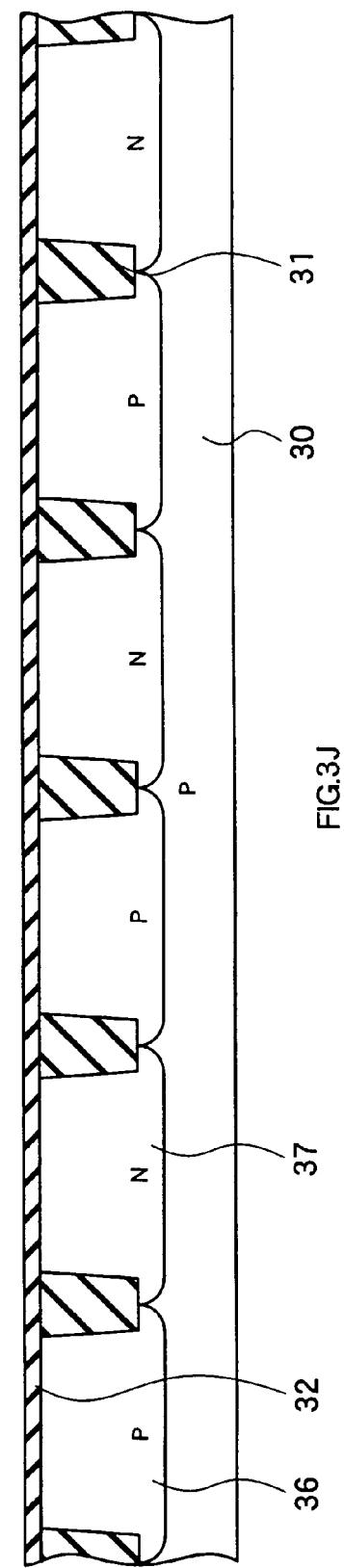

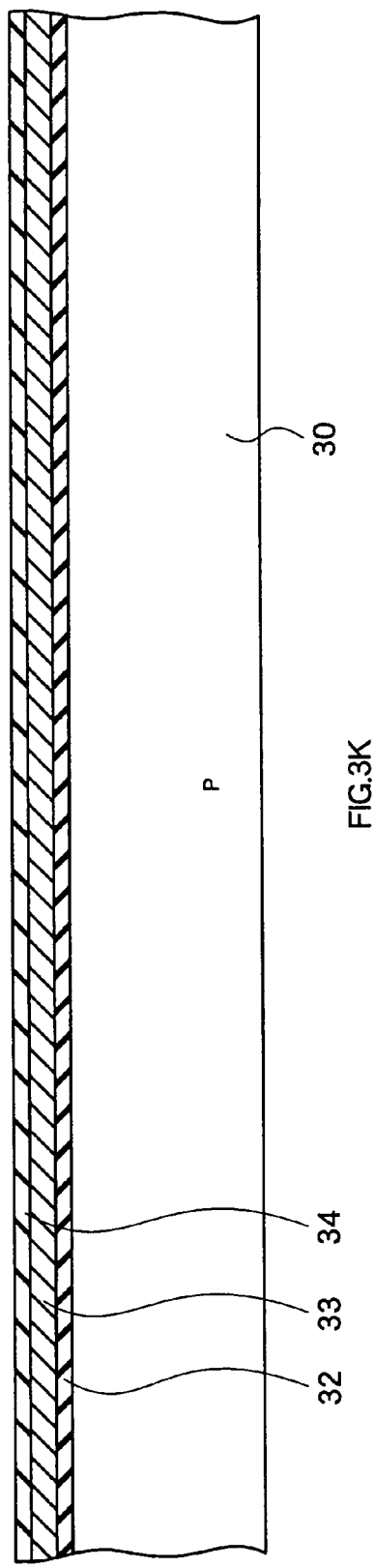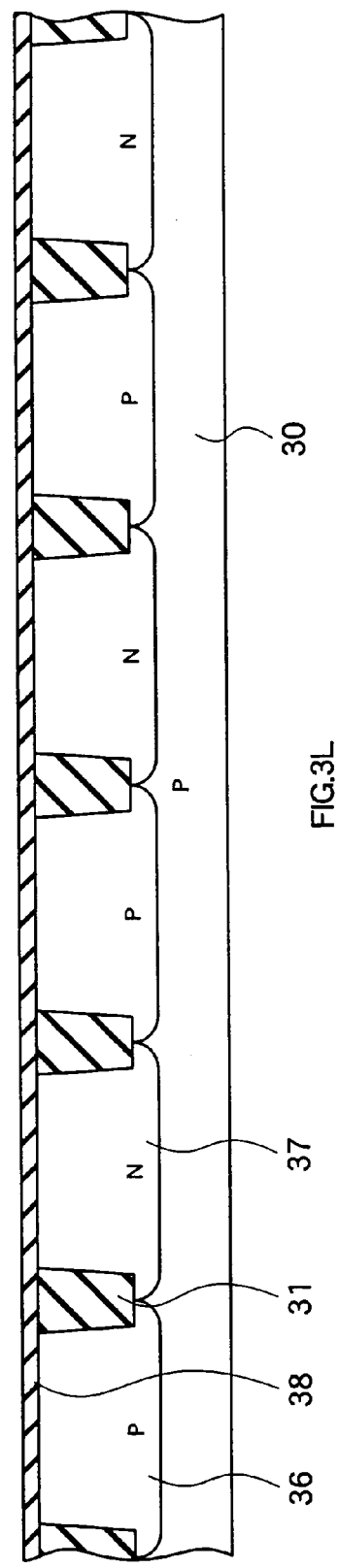
FIG.3K
FIG.3L

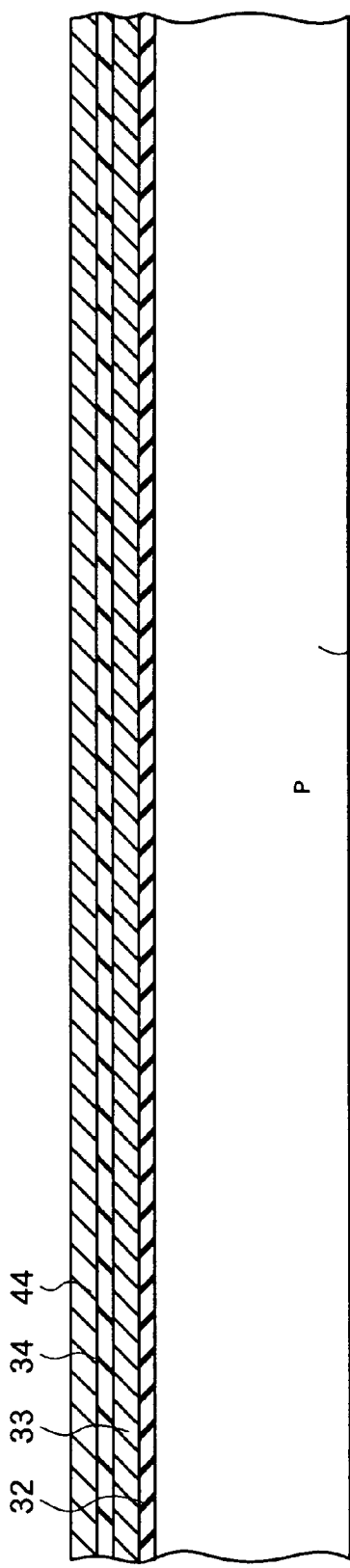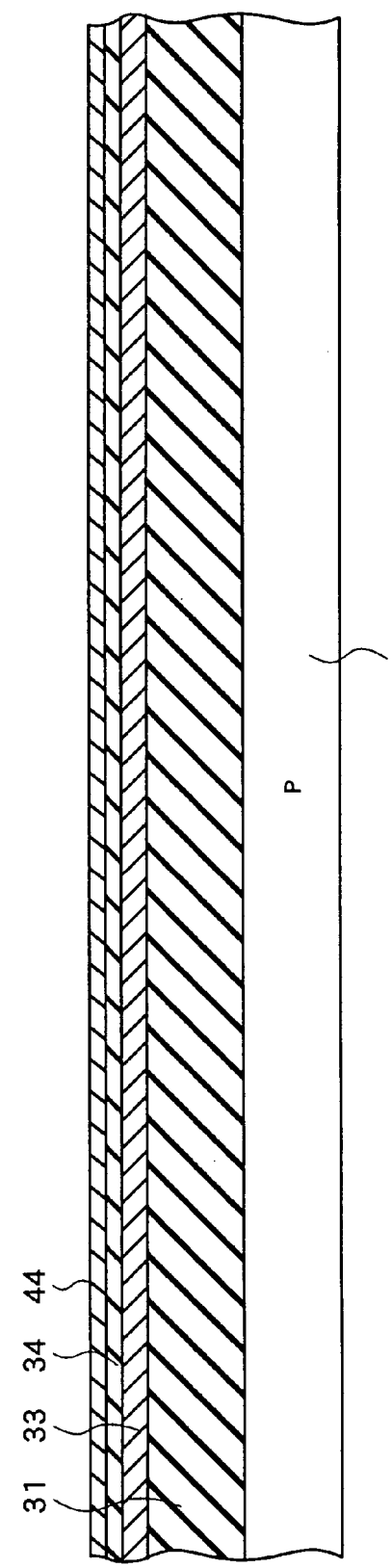
FIG.5A
FIG.5B

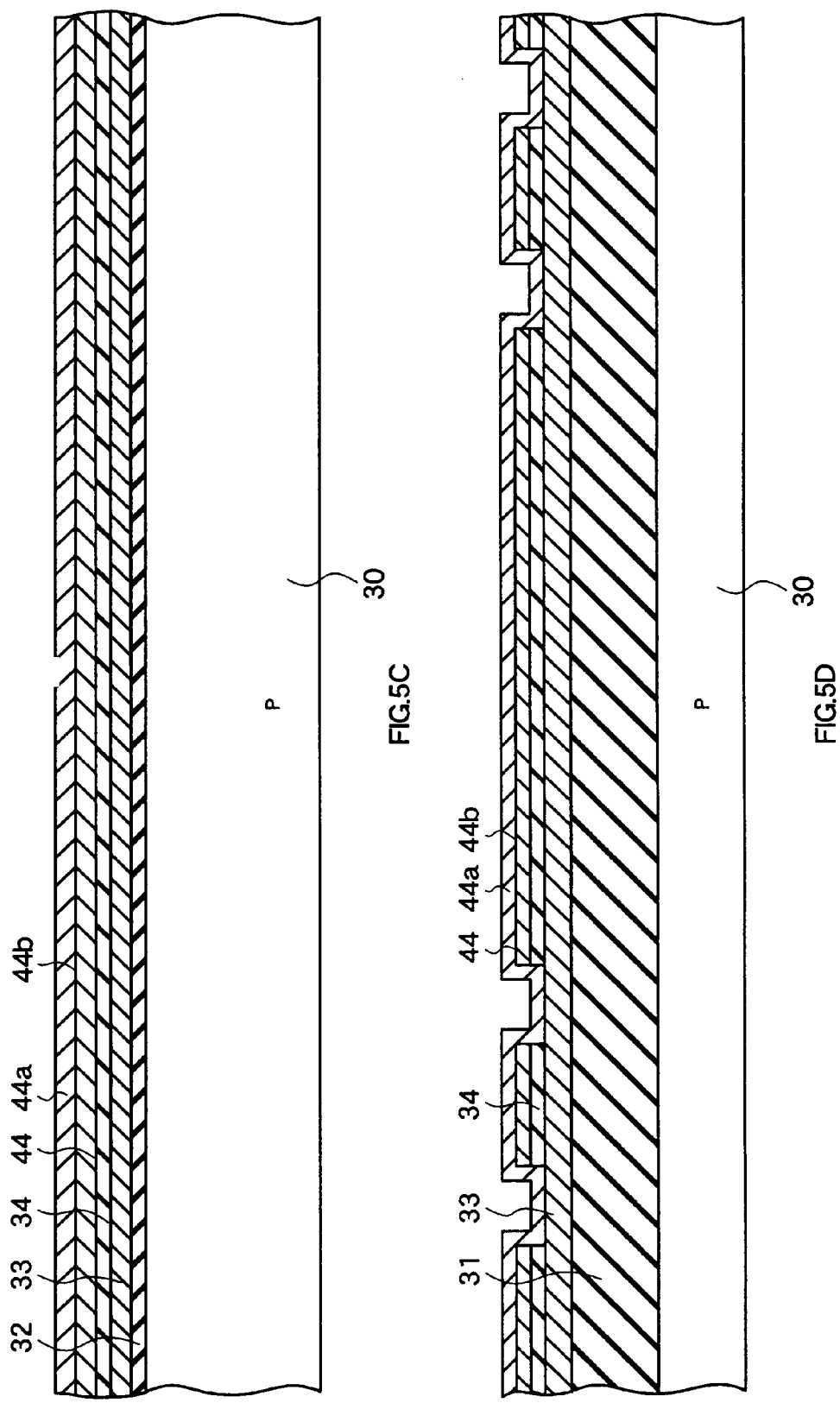

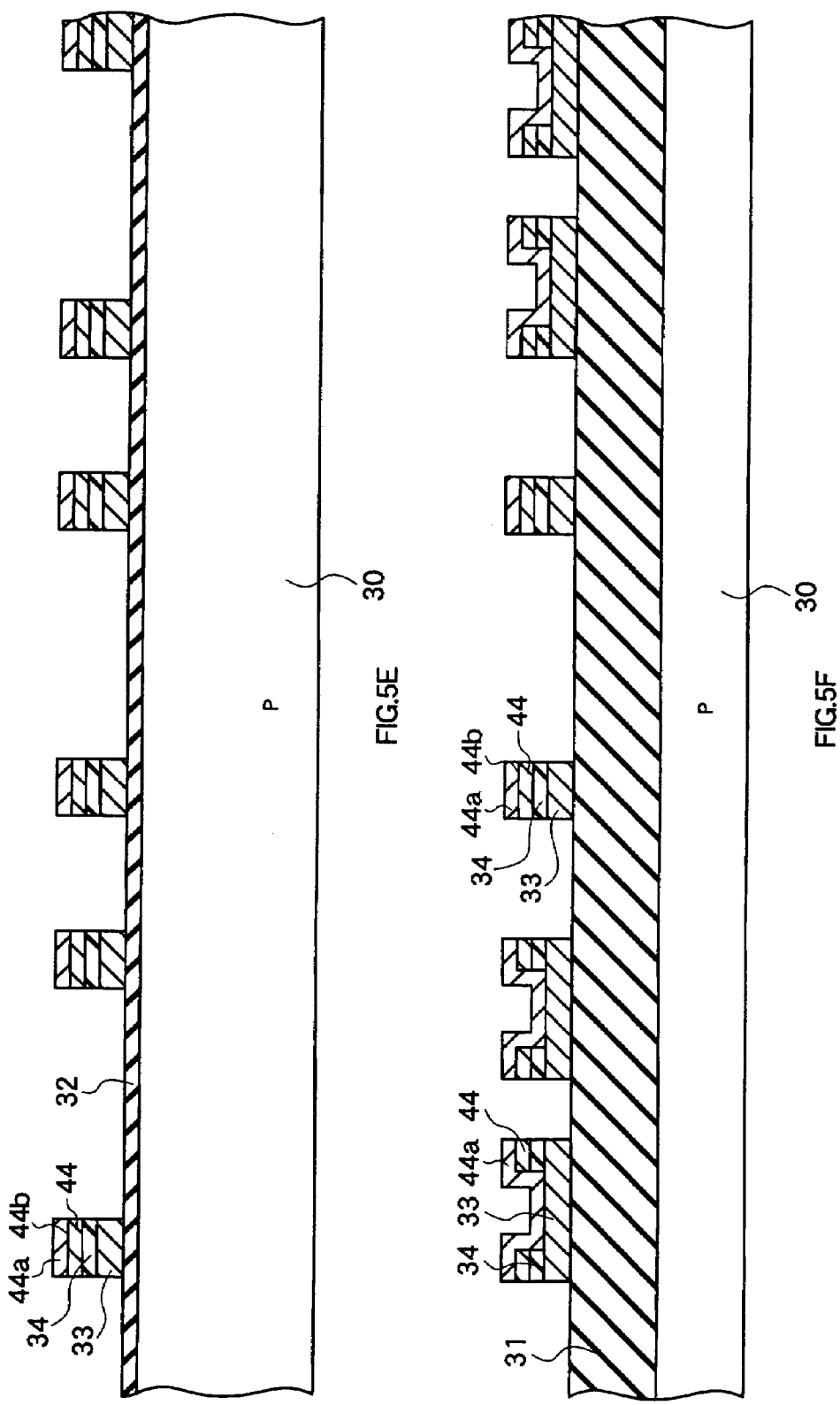

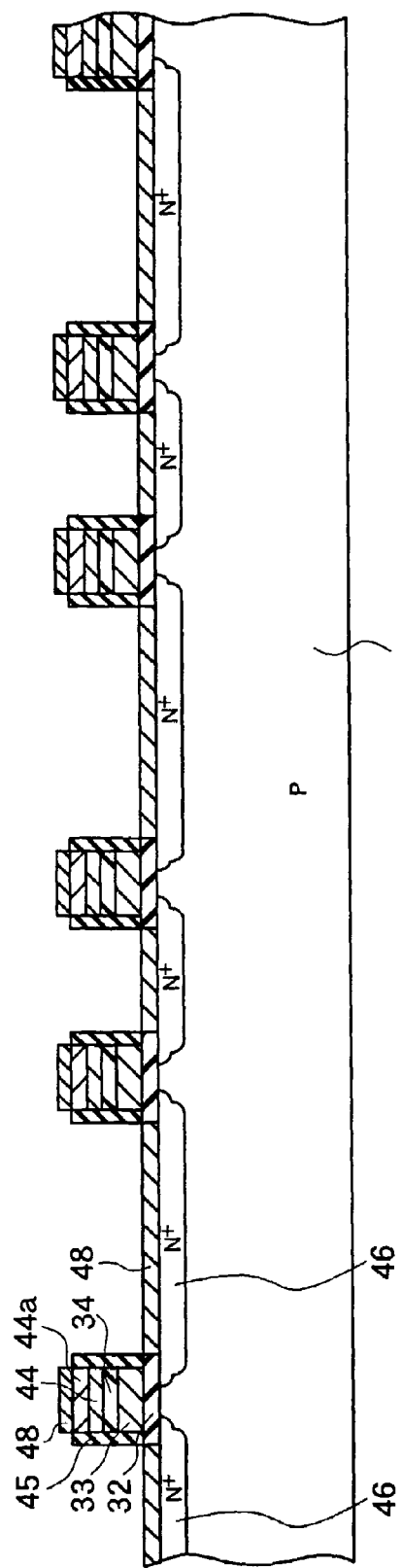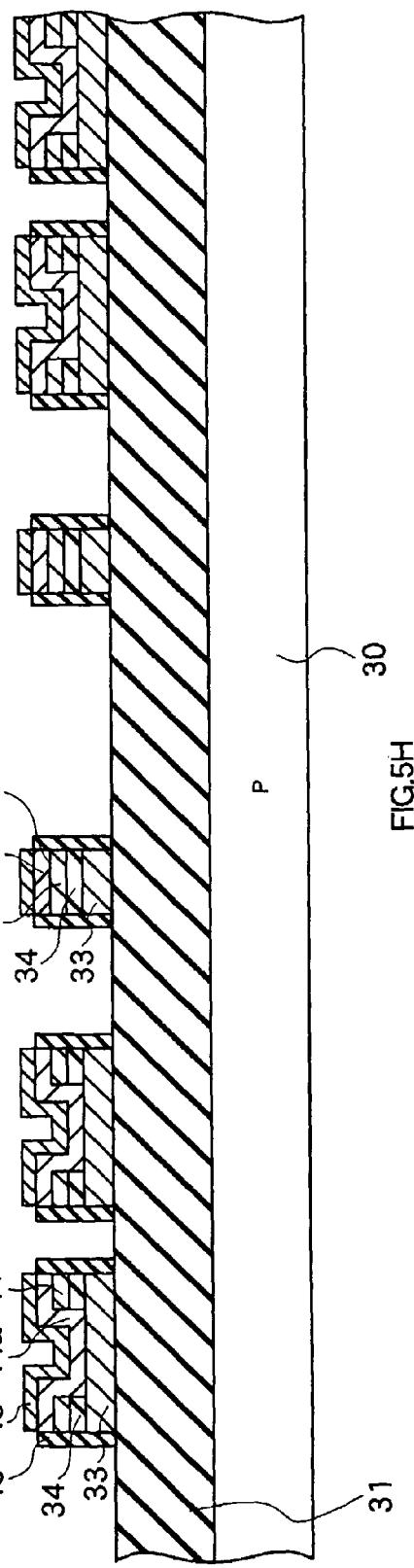

SEMICONDUCTOR DEVICE INCLUDING NONVOLATILE MEMORY

CROSS REFERENCE TO RELATED APPLICATION

This application is based upon and claims the benefit of priority from the prior Japanese Patent Application No.2003-188889, filed on Jun. 30, the entire contents of which are incorporated herein by reference.

FIELD OF THE INVENTION

The present invention relates to a semiconductor device including a nonvolatile memory and a method of fabricating the semiconductor device.

DESCRIPTION OF THE BACKGROUND

A NAND-type flash memory and a NOR-type flash memory have been widely used as nonvolatile memory devices. In recent years, flash memory devices having advantages of both a NAND-type flash memory and a NOR-type flash memory have been proposed. The demand for a system LSI including flash memory circuits as well as logic circuits has also increased.

The system LSI including flash memory circuits and logic circuits have a complicated device structure. The structure of a memory cell of a flash memory differs from that of a MOS transistor of a logic circuit. The memory cell has a gate structure, which is generally provided with double gate electrodes, while the MOS transistor has single gate electrode.

Moreover, the fabrication process of a flash memory partially differs from that of a logic circuit. For example, the storage characteristics are important for a gate insulating film of a flash memory. On the other hand, the reduction of gate capacitance is necessary for a gate insulating film of a logic circuit. In a system LSI, it is required to satisfy performances of both a flash memory and a logic circuit.

Furthermore, it is also required, in the system LSI, to adjust a fabrication process and a device structure between a flash memory and a logic circuit.

Japanese Patent Publication (Kokai) No.2002-64157 discloses a device structure and fabrication method of LSI including both a flash memory and a logic circuit. For example, a layered structure of three polycrystalline silicon films is used as two gate electrodes. The impurity doping condition is changed for each of the polycrystalline silicon films.

As mentioned above, a system LSI having more excellent performance can be fabricated by adjusting the device structure and the fabrication process between a flash memory and a logic circuit.

However, further improvement is required for higher speed performance of a logic circuit in a future LSI including a flash memory and a logic circuit.

SUMMARY OF THE INVENTION

In order to meet the above-described requirement, a first aspect of the invention comprise a semiconductor substrate, a nonvolatile memory cell including a first MOS transistor having a first gate formed on the semiconductor substrate, and a source and a drain region formed in the semiconductor substrate to interpose a surface region of the semiconductor substrate beneath the first gate, the first gate being a layered gate structure having a first gate insulating film, a first gate electrode film, a second gate insulating film and a second gate electrode film, and a logic circuit including a plurality of second MOS transistors having a second gate formed on the semiconductor substrate, and a source and a drain region in the semiconductor substrate to interpose a surface region of the semiconductor substrate beneath the second gate, the second gate being a gate structure having a third gate insulating film and a second gate electrode film.

Further, another aspect of the invention may comprise forming an element isolation area surrounding an element area in a semiconductor substrate, forming a first gate insulating film on the element area, forming a first gate electrode film on the first gate insulating film, removing selectively the first gate electrode film and the first gate insulating film on a nonvolatile memory cell region in the element area, forming a second gate insulating film on the first gate electrode film, removing the second gate insulating film, the first gate electrode film and the first gate insulating film, respectively, on a logic circuit region in the element area, forming a third gate insulating film on the semiconductor substrate in the logic circuit region, forming a second gate electrode film on the second gate insulating film and the third gate insulating film, removing selectively the second gate electrode film, the second gate insulating film and the first gate electrode film in the nonvolatile memory cell region, and removing selectively the second gate electrode film in the logic circuit region, and forming a source and a drain region in the semiconductor substrate to interpose a surface region of the semiconductor substrate beneath the first gate insulating film and the third gate insulating film, by introducing impurities into the semiconductor substrate using the second gate electrode film as a mask.

BRIEF DESCRIPTION OF THE DRAWINGS

FIGS. 5A to 5H are cross-sectional views showing a fabrication method of a semiconductor device in the second embodiment of the present invention;

DETAILED DESCRIPTION OF THE INVENTION

Figure 1:
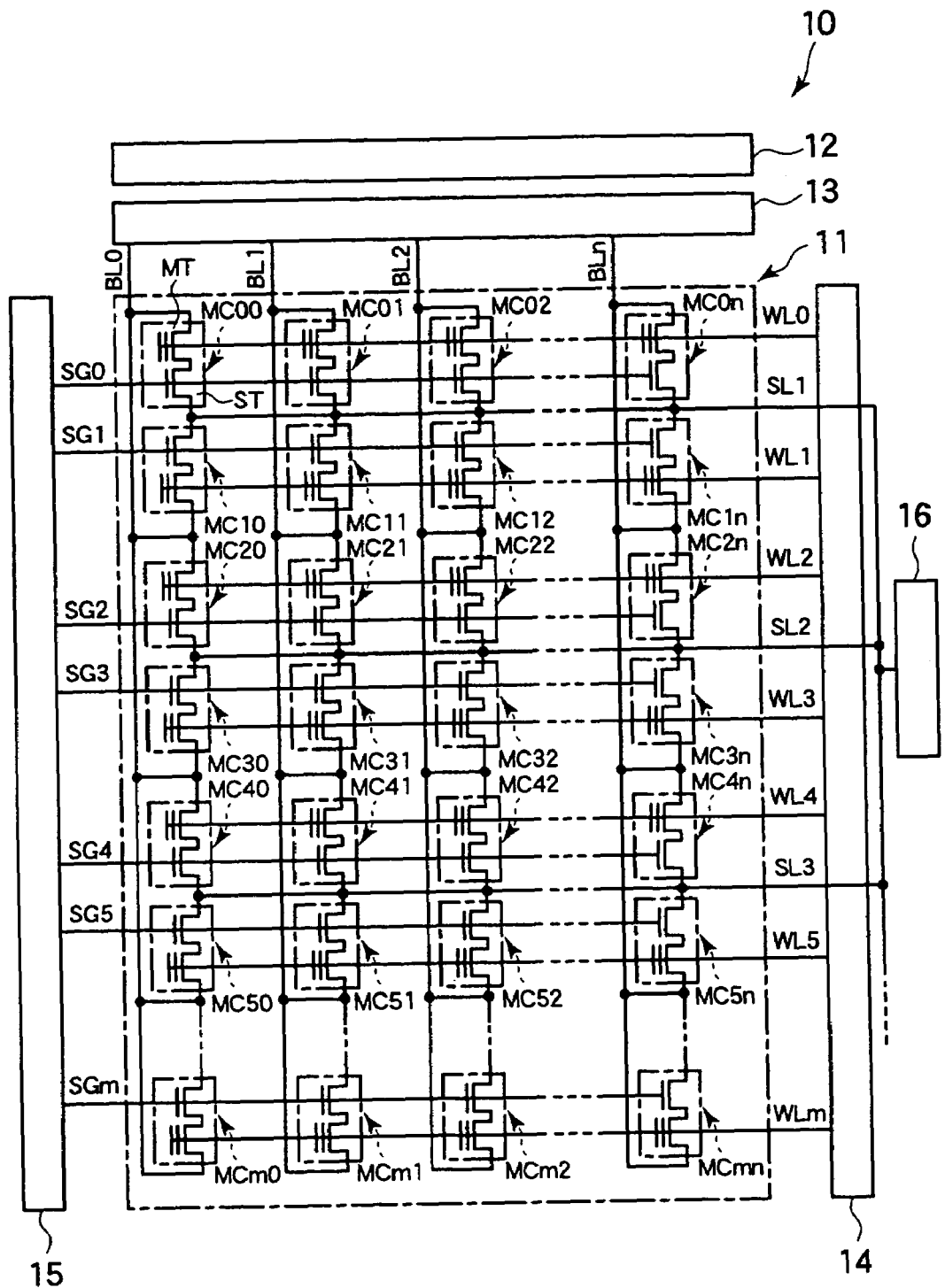
FIG. 1 is a circuit block diagram showing a nonvolatile memory in a first embodiment of the present invention.

Embodiments of the present invention are described below in detail with reference to the drawing mentioned above.

A first embodiment of the invention is hereinafter explained.

A nonvolatile memory of the first embodiment is a flash memory having a memory cell formed of two first MOS transistors.

The first MOS transistor has a first gate of a layered structure. The layered structure includes a first insulating film for a tunnel insulating film, a first gate electrode film for a floating gate electrode film, a second gate insulating film for an inter-gate insulating film and a second gate electrode film for a control gate electrode film.

On the other hand, a logic circuit of the first embodiment includes a periphery circuit. The logic circuit contains a CMOS logic circuit having second MOS transistors. Each of the second MOS transistors has a second gate, which is a layered structure of a third gate insulating film and the second gate electrode film.

Moreover, the third gate insulating films of the second MOS transistors have three kinds of different film thicknesses respectively. Each of the three kinds of film thicknesses corresponds to a supply voltage to be applied to each second MOS transistor. The third gate insulating films of a maximum, a medium and a minimum film thickness are formed for a high-voltage, a middle-voltage and a low-voltage transistor, respectively.

Furthermore, thickness of the second gate insulating film of the nonvolatile memory is formed at a thickness between the maximum film thickness and the medium film thickness of the third gate insulating films.

FIG. 1 shows a block diagram of the nonvolatile memory in the first embodiment of the present invention.

A nonvolatile memory 10 has a memory cell array 11, a column decoder 12, a sense amplifier 13, low decoders 14 and 15, and a source line driver 16. Memory cell array 11 includes a plurality of memory cells MC.

Each of memory cells MC has a memory cell transistor MT and a select transistor ST. The electrical current path of a memory cell transistors MT and a select transistors ST is connected with each other in series. Each of the source regions of memory cell transistors MT connects to each of the drain regions of select transistors ST.

Moreover, each pair of memory cells MC adjoining mutually in the column direction share the source region of select transistors ST or the drain region of memory cell transistors MT of the pair.

The control gate of memory cell transistors MT in the row direction is connected in common with a word line WL. The gate of select transistors ST in the row direction is connected in common with a select gate line SG. The drain regions of memory cell transistors MT are arranged in the column direction and are connected in common with a bit line. The source region of select transistors ST are connected in common with a source line SL. Source line SL are connected to source line driver 16.

Figure 2:
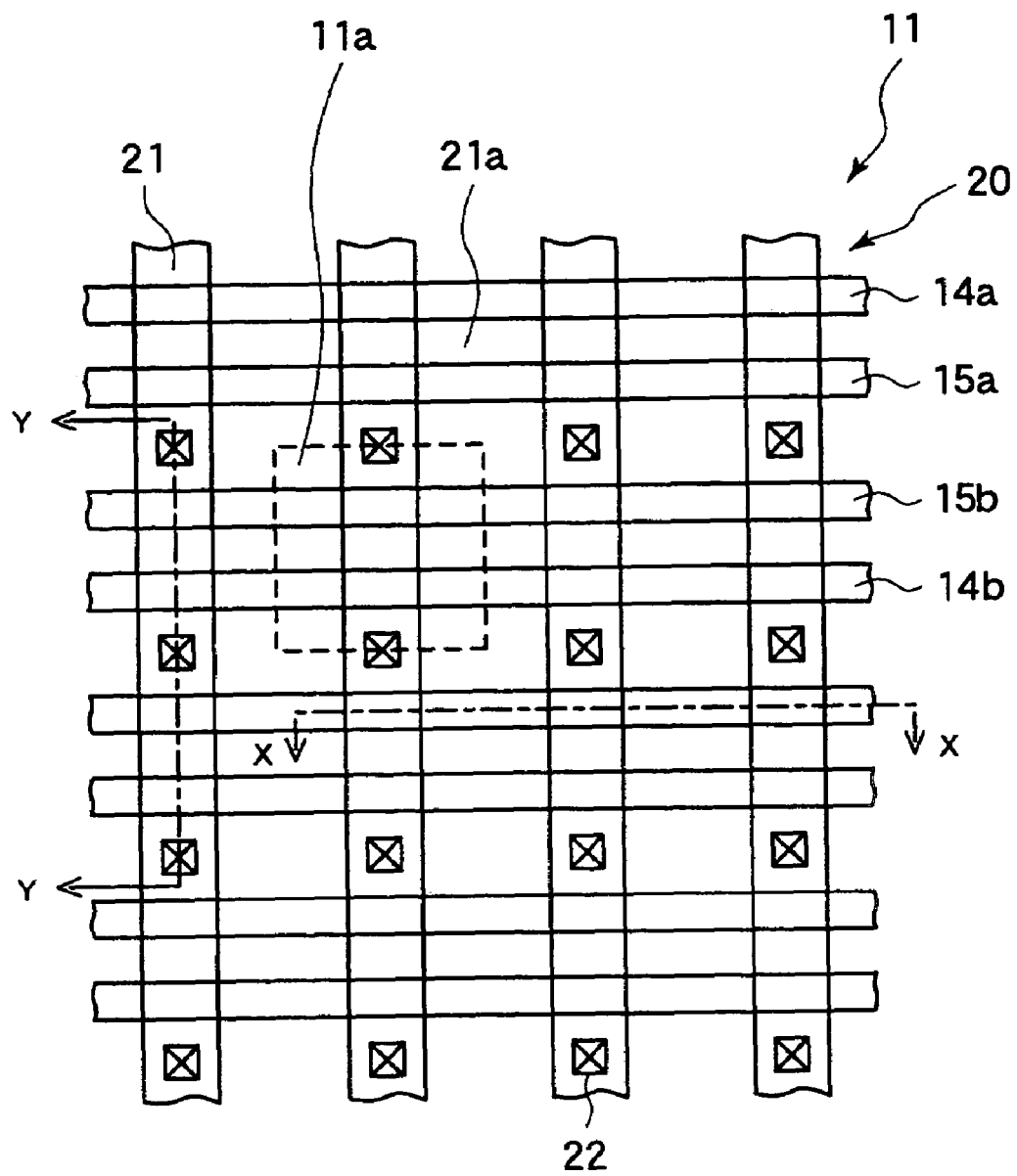
FIG. 2 is a schematic plane view showing the nonvolatile memory in the first embodiment of the present invention.

FIG. 2 shows a schematic plane view of a memory cell array 11. An element isolation region 21a is formed in silicon substrate 20. Element regions 21 of a rectangle shape surrounded by element isolation region 21a are formed. Word lines 14a and 14b and select gate lines 15a and 15b, formed of the first gate electrode film, are formed in memory cell array 11. Word lines 14a and 14b and select gate lines 15a and 15b extend perpendicularly and cross over a plurality of device regions 21.

Memory cell transistors MT are respectively formed at the portion where word lines 14a and 14b intersect device regions 21. Select transistors ST are formed at the portions where select gate lines 15a and 15b intersect device regions 21.

A floating gate electrode film (not illustrated) is formed at the portion where word lines 14a and 14b intersect device regions 21. The floating gate electrode film, which is formed of a second gate electrode film, in a memory cell transistor is separated from another memory cell transistor.

A contact plugs 22 of element region 21 sandwich word lines 14a and select gate lines 15a, and word line 14b and select gate lines and 15b. Bit lines (not illustrated) are formed along with element regions 21. The bit lines connect between contact plugs 22.

Memory cell transistors MT and select transistors ST, which are sandwiched by each two of contact plugs 22, form memory cell units 11a.

Figure 3M:
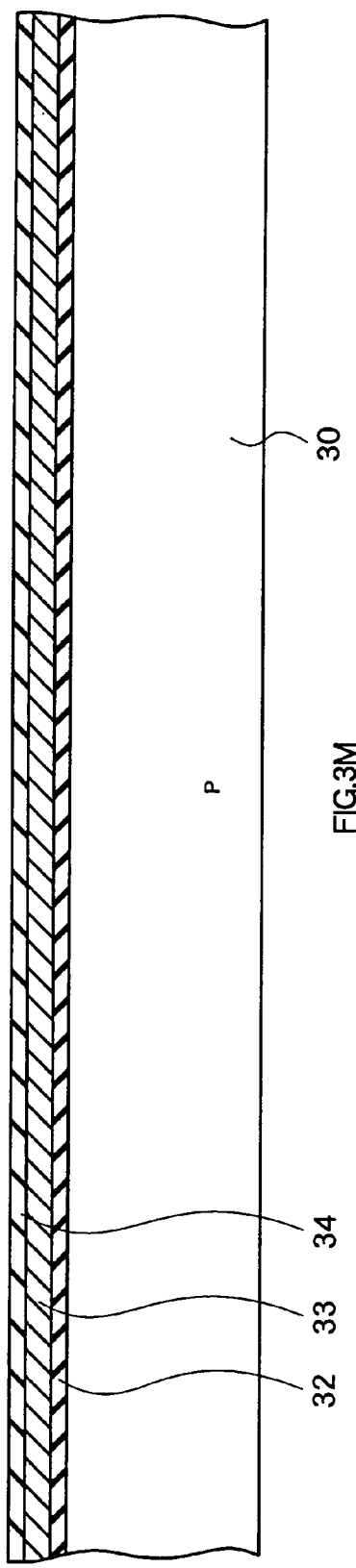
FIGS. 3A to 3V are cross-sectional views showing a fabrication method of a semiconductor device in the first embodiment of the present invention.
Figure 3N:
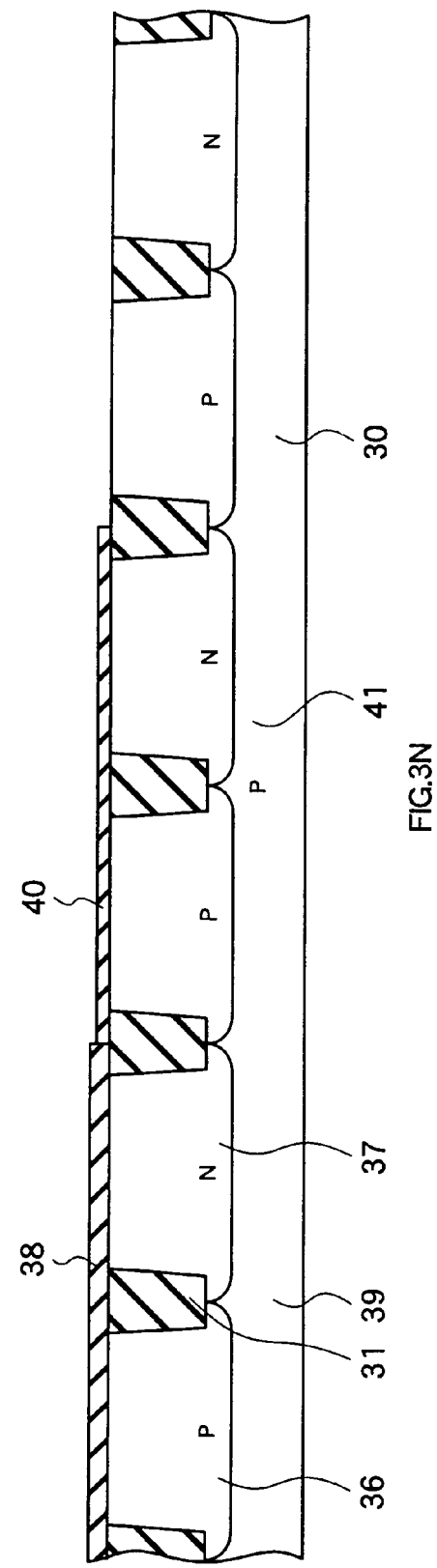
Figure 3O:
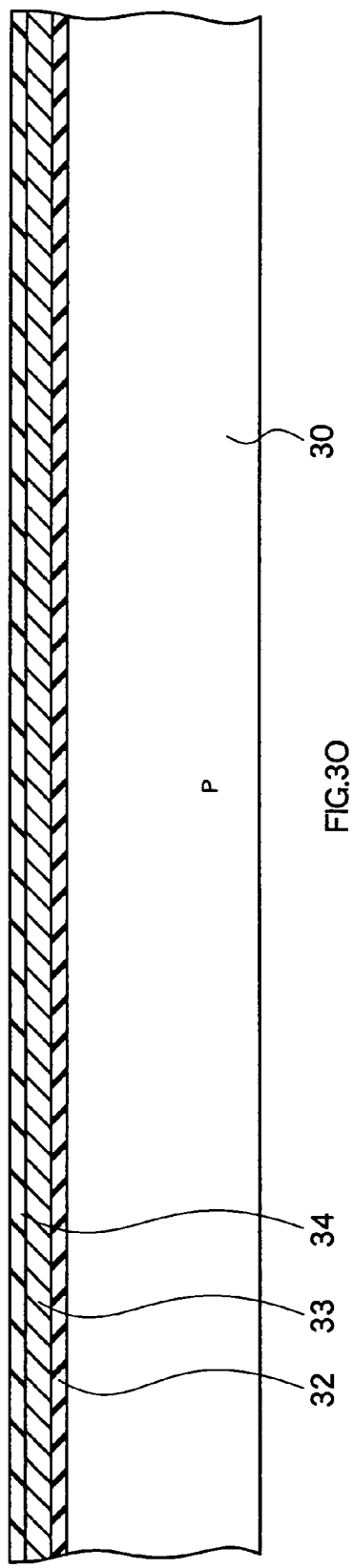
Figure 3P:
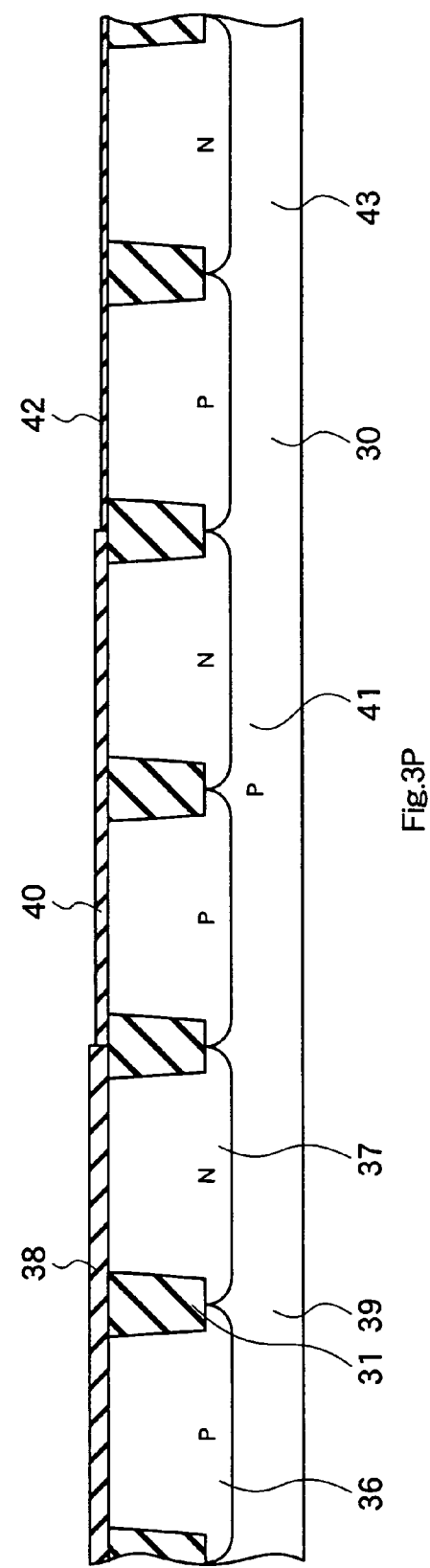
Figure 3Q:
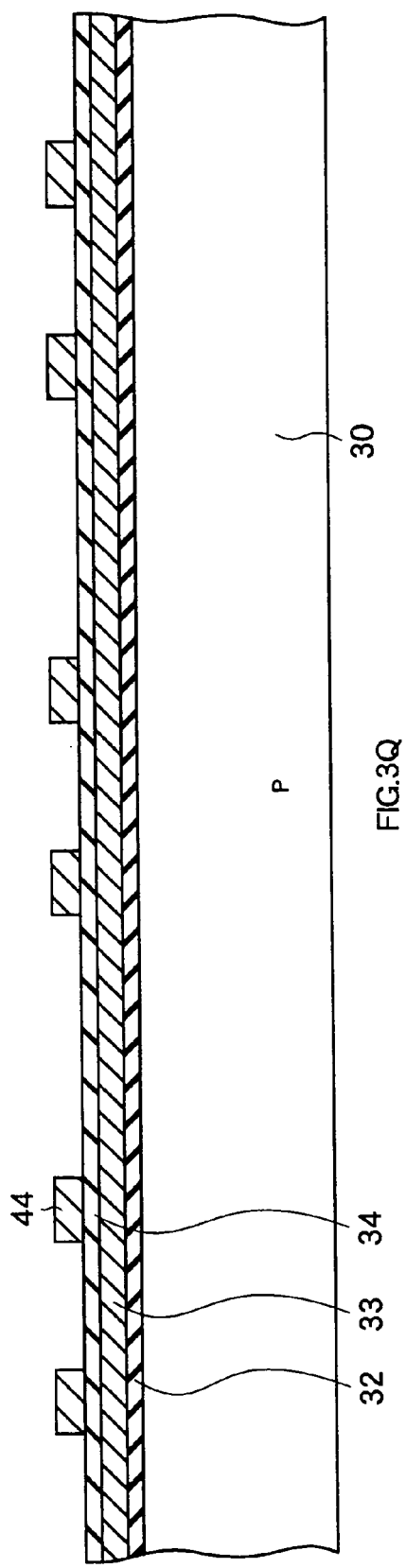
Figure 3R:
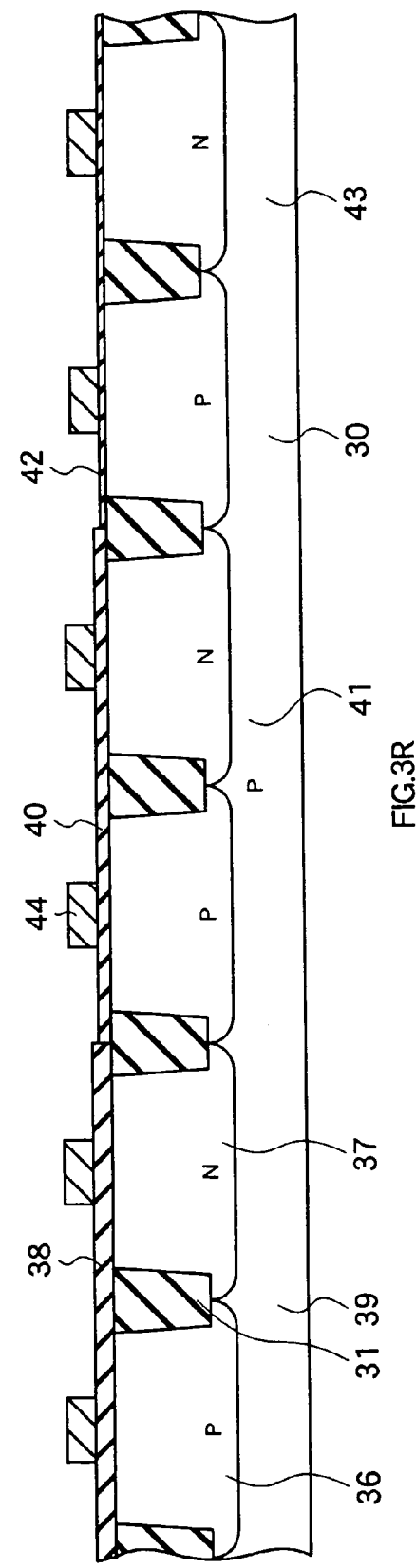
Figure 3S:
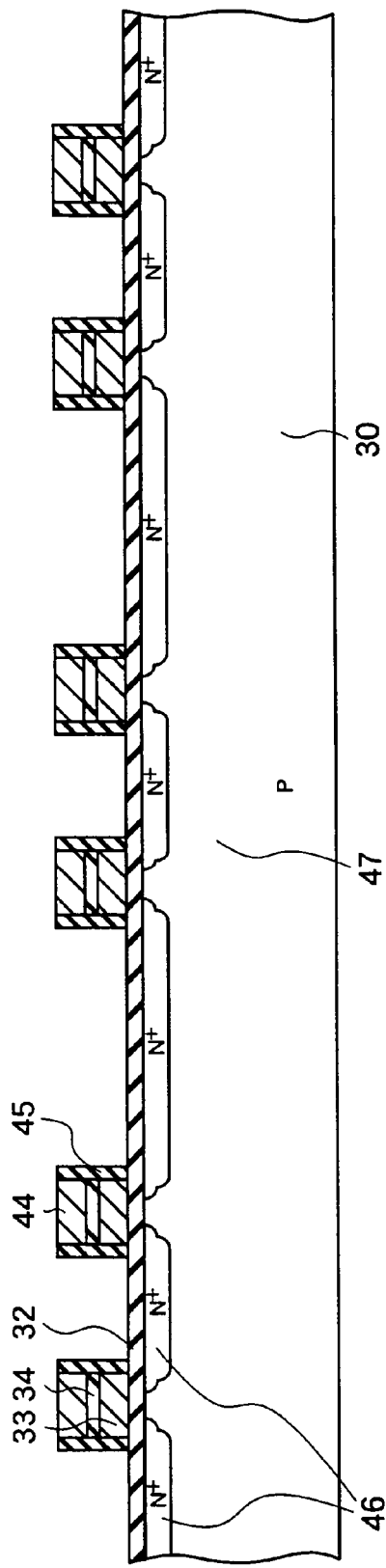
Figure 3T:
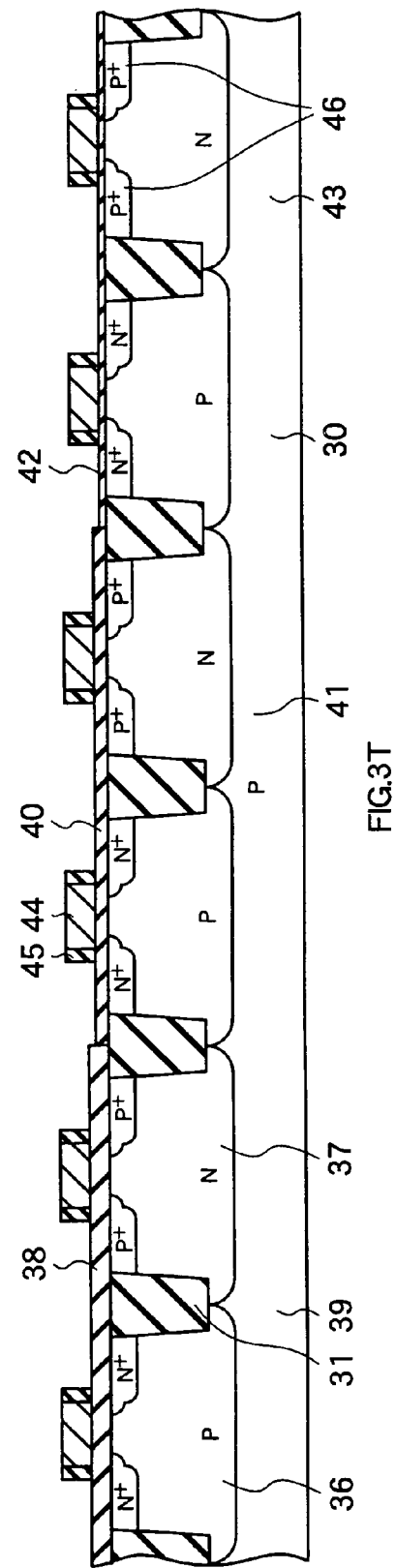
Figure 3U:
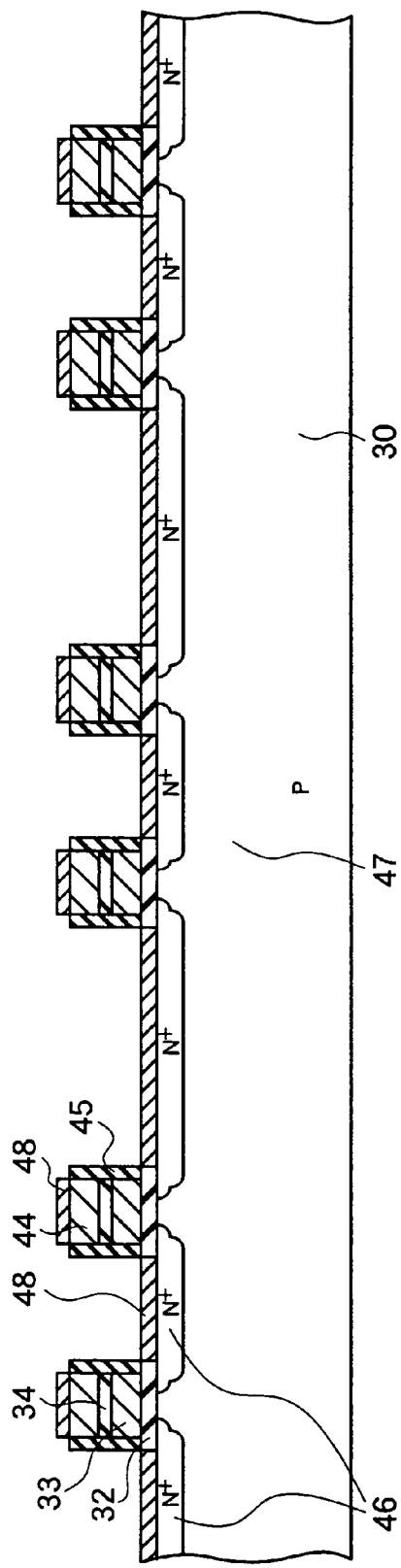
Figure 3V:
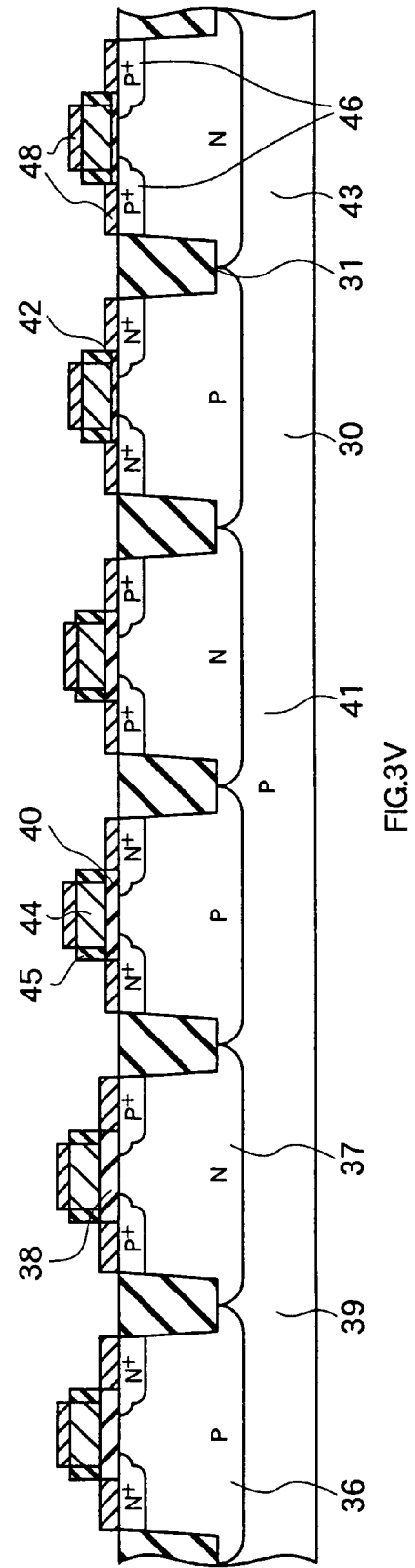

FIGS. 3A to 3V are cross sectional views showing a fabrication method of a semiconductor device in the first embodiment of the present invention.

Pairs of a nonvolatile memory and a CMOS logic circuit are shown in FIGS. 3A to 3V. In other word, FIGS. 3A, 3C, 3E, 3G, 3I, 3K, 3M, 3O, 3Q, 3S and 3U show the cross sectional views of the nonvolatile memory. On the other hand, FIGS. 3B, 3D, 3F, 3H, 3J, 3L, 3N, 3P, 3R 3T and 3V show the cross-sectional views of the CMOS logic circuit.

Moreover, FIGS. 3U and 3V show cross-sectional views of a semiconductor device in the first embodiment of the present invention.

Along with the steps of the fabrication processes, cross-sectional views of the nonvolatile memory are described below. FIGS. 3A, 3C and 3E enlarged cross sectional views along the line X—X of FIG. 2. FIGS. 3G, 3I, 3K, 3M, 3O, 3Q, 3S and 3U enlarged cross sectional views along the line Y—Y of FIG. 2.

On the contrary, cross sectional views of the CMOS logic circuit in FIGS. 3B, 3D, 3F, 3H, 3J, 3L, 3N, 3P, 3R 3T and 3V are shown without changing the cross-sectional direction. First, steps of forming an element isolation area are explained blow.

As shown in FIGS. 3a and 3b, a p-type silicon substrate 30 is prepared as a semiconductor substrate. A layered film of a silicon oxide film and a silicon nitride film, which are not illustrated, are formed on silicon substrate 30. The layered film is selectively delineated by using lithography and dry etching. As a result, a layered pattern is formed on silicon substrate 30. A groove is formed in silicon substrate 30 by using dry etching, using the layered pattern as a mask.

A silicon oxide film is formed on silicon substrate 30 including the groove by using CVD. The silicon oxide film and the layered pattern formed on silicon substrate 30 are etched flatly by using CMP and etching, and the silicon oxide formed in the groove finally remains. The groove buried with the silicon oxide film is an element isolation area 31.

Steps of forming a gate structure of the nonvolatile memory are explained blow.

As shown in FIGS. 3C and 3D, the silicon oxide film having a thickness of such as 10 nm is thermally grown on silicon substrate 30 to form a first gate insulating film 32. A phosphorus-doped polycrystalline silicon film or a phosphorus-doped amorphous silicon film having a thickness of such as 80 nm is deposited by using CVD to form a first gate electrode film 33.

In the case of depositing the silicon film without doping phosphorus, a conductive impurity such as phosphorus or arsenic is introduced into the silicon film by subsequent ion-implantation with a dose of 1 E15 $cm^{-2}$ to 1 E16 $cm^{-2}$.

A film as a mask (not illustrated) is formed on the surface of the CMOS logic circuit region in FIG. 3D by using CVD, lithography and dry etching.

The polycrystalline silicon film or the amorphous silicon film and the silicon oxide film in the nonvolatile memory area of FIG. 3C are selectively patterned by using lithography and dry etching. Accordingly, a first gate insulating film 32 and a first gate electrode film 33 is formed.

In the nonvolatile memory region, first gate insulating film 32 is the tunnel insulating film and first gate electrode film 33 is the floating gate electrode film.

As shown in FIGS. 3E and 3F, a second insulating film 34 is formed on silicon substrate 30. Second insulating film 34 may be a layered structure including a plurality of insulating film.

For example, a silicon oxide film, a silicon nitride film, and another silicon oxide film are continuously formed in the same CVD equipment. The whole film thickness of the layered structure is such as approximately 15 nm.

Second insulating film 34 is the inter-gate insulating film in the nonvolatile memory. The second insulating film 34 is also formed on the CMOS logic circuit region in FIG. 3F, but it is not used for the gate material in the CMOS logic circuit. The second insulating film 34 of the CMOS logic circuit is removed as mentioned later.

Steps of forming a transistor of the nonvolatile memory and the CMOS logic circuit are explained blow.

FIG. 3G shows a cross sectional view along the line Y—Y of FIG. 2. FIG. 3H shows the same steps as the steps shown in FIG. 3E. As shown in FIG. 3G, the layered structure of first insulating film 32, first gate electrode film 33, and second gate insulating film 34 is formed on silicon substrate 30 in the Y—Y direction. The cross sectional view is used for explaining the steps fabricating nonvolatile memory mentioned below. On the other hand, the cross sectional view of the CMOS logic circuit region is the same as the former process shown in FIG. 3H.

The nonvolatile memory region is covered with a resist film or an insulating film as a mask film 35 as shown in FIG. 3I. Second insulating film 34 and first gate electrode film 33 in the CMOS logic circuit region are removed by using dry etching and wet etching as shown in FIG. 3J. Accordingly, first insulating film 32 remains on the silicon substrate 30 of the CMOS logic circuit region.

Furthermore, by using lithography and ion implantation, a p-type well 36 and n-type well 37 are formed in the CMOS logic circuit region, respectively, as shown in FIG. 3J. Subsequently, first insulating film 32 is removed by using dry etching and wet etching.

Three kinds of third gate insulating film each having a different film thickness is formed on silicon substrate 30 in the CMOS logic circuit region. The third gate insulating film is a silicon oxide film.

As shown in FIG. 3L, a third gate insulating film of the maximum film thickness 38 is formed by using thermal oxidation. The film thickness is approximately 16 nm. Third gate insulating film of the maximum film thickness 38 is the gate oxide film in high-voltage transistor 39 in the CMOS logic circuit as shown in FIG. 3N.

Third gate insulating film of the maximum film thickness 38 is selectively delineated by using wet etching except a region forming high-voltage transistor 39. Third gate insulating film of the medium film thickness 40 is formed by using thermal oxidation. The film thickness is approximately 9 nm. Third gate insulating film of the medium film thickness 40 is the gate oxide film of middle-voltage transistor 41 in the CMOS logic circuit. According to this oxidation process, third gate insulating film of the maximum film thickness 38 is also grown and the film thickness slightly increases.

Third gate insulating film of the medium film thickness 40 is selectively delineated by using wet etching except a region forming high-voltage transistor 39 and middle-voltage transistor 41.

As shown in FIG. 3P, third gate insulating film of the minimum film thickness 42 is formed by using thermal oxidation. The film thickness is approximately 3 nm. Third gate insulating film of minimum film thickness 42 is the gate oxide film of low-voltage transistor 43 in the CMOS logic circuit.

According to this oxidation process, third gate insulating film of the maximum film thickness 38 and third gate insulating film of the medium film thickness 40 are also grown and the film thicknesses slightly increase. For example, the maximum film thickness 38 is approximately 18 nm and the medium film thickness 40 is approximately 11 nm.

Moreover, the thickness of the second insulating film 34 of the nonvolatile memory is approximately 15 nm, as mentioned above. Therefore, the second insulating film 34 is thinner than third gate insulating film of the maximum film thickness 38, and thicker than third gate insulating film of medium film thickness 40.

According to the steps mentioned above, the gate insulating film of the transistors corresponding to a plurality of supply voltages to be applied to the transistors in the CMOS logic circuit can be formed.

On the other hand, in the nonvolatile memory region shown in FIGS. 3I, 3K, 3M and 3O, as the second gate insulating film acts as a mask, the third gate insulating films are not grown by thermal oxidation. The gate structure in the nonvolatile memory area is the same as the structure shown in FIG. 3G.

In the middle of the fabrication steps mentioned above, for example, a step following the third gate insulating film of medium thickness 40 or the end of the steps, conductive impurities can be introduced into the channel region of silicon substrate 30 by using ion implantation. Boron ion for p-type impurity and phosphorus ion or arsenic ion for n-type impurity, respectively, may be implanted with a dose of approximately 1 E11 $cm^{-2}$ to 1 E13 $cm^{-2}$ into silicon substrate 30.

The impurity dose or the impurity profile in depth of silicon substrate 30 can be changed in each transistor. In this case, the region implanted no impurity is covered with a mask by using lithography.

A polycrystalline silicon film or an amorphous silicon film of approximately 50 nm is formed in both the nonvolatile memory region and the CMOS logic circuit region by using CVD. A polycrystalline silicon film or an amorphous silicon film is selectively patterned by using lithography and dry etching. As a result, the second gate electrode film 44 is formed as shown in FIGS. 3Q and 3R. The second gate electrode film 44 is the control gate electrode film of the nonvolatile memory and the gate electrode film of the CMOS logic circuit.

The CMOS logic circuit area is covered with a mask (not illustrated). As shown in FIG. 3S, second gate insulating film 34 and first gate electrode film 33 are selectively patterned by using second gate electrode film 44 as a mask in the nonvolatile memory region.

Conductive impurities are introduced into silicon substrate 30 in both the nonvolatile memory region and the CMOS logic circuit region by using ion implantation, using second gate electrode film 44 as a mask. A source and a drain region with a comparatively shallow junction depth (not illustrated) are formed. Boron such as a p-type impurity is implanted with a dose of 1E15 cm$^{-2}$ to 1E16 cm$^{-2}$. Phosphorus or arsenic such as an n-type impurity is implanted with a dose of 1E15 cm$^{-2}$ to 1E16 cm$^{-2}$.

An insulating film such as a silicon nitride is formed on second gate electrode film 44 by using CVD. The surface region of the insulating film is removed by using dry etching. As a result, a sidewall insulating film 45 is selectively formed on a side surface of the layered structure as shown in FIGS. 3S and 3T.

The layered structure of first gate insulating film 32, first gate electrode film 33, second gate insulating film 34, and second gate electrode film 44 is the first gate of the nonvolatile memory as shown in FIG. 3S. Moreover, the layered structure of the third gate insulating film 38, 40, and 42 and second gate electrode film 44 is the second gate of the logic circuit as shown in FIG. 3S.

Conductive impurities are introduced into silicon substrate 30 in both the nonvolatile memory region and the CMOS logic circuit region by using ion implantation, using second gate electrode film 44 and sidewall insulating film 45 as a mask. A source and a drain region with a comparatively deep junction depth are formed. Boron such as a p-type impurity is implanted with a dose of 1E15 cm$^{-2}$ to 1E16 cm$^{-2}$. Phosphorus or arsenic such as an n-type impurity is implanted with a dose of 1E15 cm$^{-2}$ to 1E16 cm$^{-2}$.

Source and drain region 46 including also the comparatively shallow source and drain described previously, is finally formed as shown in FIGS. 3S and 3T. Moreover, the two transistors share source and drain region 46 each other in the nonvolatile memory region is a memory cell 47 as shown in FIG. 3S.

A Co-film is formed in both the nonvolatile memory area and the CMOS logic circuit region. A cap film, such as Ti or TiN, may be further formed on the Co-film, as required. By subsequent thermal annealing, a Co-salicide electrode film 48 is formed on second gate electrode film 44 and source and drain 46 as shown in FIGS. 3U and 3V.

A silicon oxide film (not illustrated) is formed on silicon substrate 30 by using plasma-assisted CVD. Contact holes are opened in the silicon oxide film. A metal interconnection including bit lines is formed. Furthermore, the formation of the silicon oxide film, the contact holes, and the metal interconnection are carried out, as required. A multilevel interconnection can be formed.

The surface of silicon substrate 30 is covered with a protective insulating film. Pad portions may be opened to finish a semiconductor device including the nonvolatile memory.

According to the embodiment, both the gate electrode film of the CMOS logic circuit and the control gate electrode film of nonvolatile memory comprised with second gate electrode film 42 are formed at a comparatively later step of the fabrication method. Therefore, subsequent thermal processes are avoided and the gate structure is suitable for miniaturization of the transistor in the CMOS logic circuit. The performance of the CMOS logic circuit in the semiconductor device including the nonvolatile memory can be improved.

Moreover, the semiconductor device including the nonvolatile memory can advance the operation speed of the CMOS logic circuit by using three kinds of transistors. Each of the transistors have different film thicknesses of the gate insulating film corresponding to the supply voltage to be applied to the transistors. The break-down gate voltage of the transistor in the nonvolatile memory cell can be increased by being the thickness of the second gate insulating film in the memory cell thicker than the gate insulating film of the medium film thickness in the CMOS logic circuit. The operation speed of the nonvolatile memory cell can be increased by being the thickness of second gate insulating film in the memory cell thinner than the gate insulating film of the maximum film thickness in the CMOS logic circuit. The semiconductor device including the nonvolatile memory with the two superior characteristics mentioned above is obtained.

The Second embodiment of present invention is hereinafter explained.

The basic structure of a second embodiment of this invention is almost the same as that of the first embodiment. A different point from the first embodiment is a point that the second embodiment has a third gate electrode film in the gate structure. The third gate electrode film is stacked on the second gate electrode film in the gate structure.

A nonvolatile memory in the second embodiment is a flash memory having a memory cell formed of two first MOS transistors.

The first MOS transistor has a first gate of a layered structure. The layered structure includes a first insulating film for a tunnel insulating film, a first gate electrode film for a floating gate electrode film, a second gate insulating film for an inter-gate insulating film, a second gate electrode film and a third gate electrode film for a control gate electrode film.

On the other hand, a logic circuit includes a periphery circuit. The logic circuit contains a CMOS logic circuit having second MOS transistors. Each of second MOS transistors has a second gate, which is a layered structure of a third gate insulating film, the second gate electrode film and the third gate electrode film.

Moreover, the third gate insulating films of the second MOS transistors have different film thicknesses respectively. Each of the three kinds of the film thicknesses corresponds to a supply voltage to be applied to each second MOS transistors. The third gate insulating films of a maximum, a medium and a minimum film thicknesses are formed for a high-voltage, a middle-voltage and a low-voltage transistors, respectively.

Furthermore, thickness of the second gate insulating film of the nonvolatile memory is formed at a thickness between the maximum film thickness and the medium film thickness of the third gate insulating film.

Figure 4:
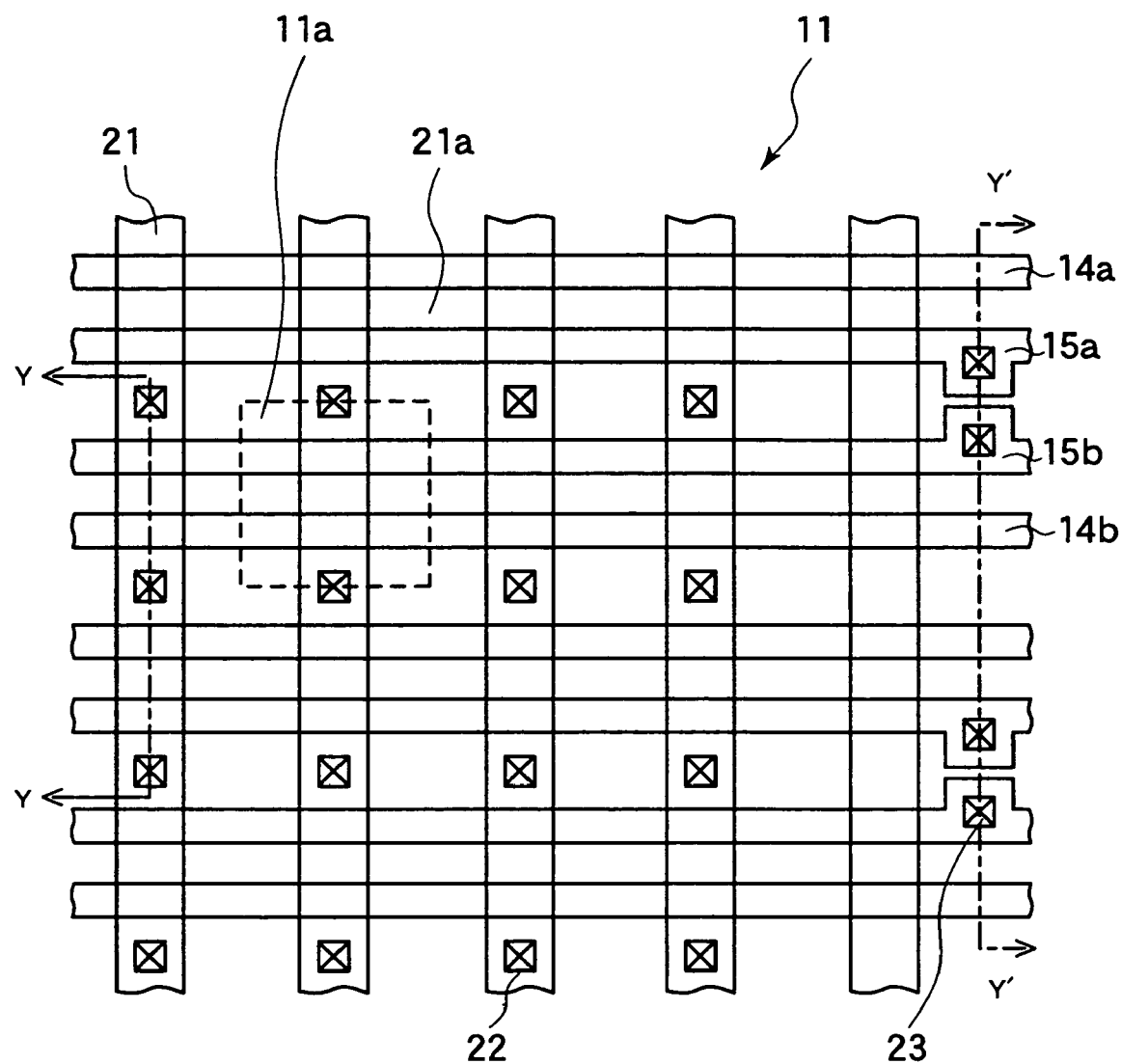
FIG. 4 is a circuit block diagram showing the nonvolatile memory in a second embodiment of the present invention.

FIG. 4 shows a schematic plane view of memory cell array 10 in the second embodiment. Because the basic structure of the memory cell array is the same as that in the first embodiment as shown in FIG. 2, only different portions are explained.

As shown FIG. 4 control gate contacts 23 is formed at the widened portion of select gate lines 15a and 15b. Select gate lines 15a and 15b are the layered gate electrode made of the second gate electrode film and the third electrode film, and contain the control gate electrode in the select transistor. The floating gate made of the first gate electrode film is formed beneath the layered gate electrode of the second gate electrode film and the third electrode film. Control gate contacts 23 connect between select gate lines 15a and 15b and the floating gate.

FIGS. 5A to 5H are cross-sectional views showing a fabrication process of a semiconductor device in the second embodiment of the present invention.

Pairs of cross sections in the nonvolatile memory are shown in FIGS. 5A to 5H. In other word, FIGS. 5A, 5C, 5E and 5G show enlarged cross-sectional views in the nonvolatile memory along the line Y—Y of FIG. 4. On the other hand, FIGS. 5B, 5D, 5F and 5H show enlarged cross-sectional views in the nonvolatile memory along the line Y'—Y' in FIG. 4. FIGS. 5G and 5H show cross-sectional views of a semiconductor device in the second embodiment of the present invention.

On the other hand, the steps fabricating the CMOS logic circuit in the second embodiment are basically the same as that in the first embodiment. Accordingly, the cross-sectional views of the CMOS logic circuit are not illustrated.

The steps from the starting process to the process formed the third gate insulating film is the same processes of the first embodiment shown in FIG. 3A to 3N. Accordingly, those figures of the processes are skipped and subsequent processes are described.

A silicon substrate 30 is prepared as a silicon substrate. As shown in FIG. 5A, a layered structure of first insulating film 32, first gate electrode film 33 and second gate insulating film 34 is formed on silicon substrate 30 in the Y—Y direction of the nonvolatile memory in FIG. 4.

As shown in FIGS. 5B, a layered structure of first gate electrode film 33 and second gate insulating film 34 is formed on element isolation region 31 in the Y'—Y' direction of the nonvolatile memory in FIG. 4.

A second gate electrode film 44 made of polycrystalline silicon film or an amorphous silicon film is formed on second gate insulating film 34 by using CVD. Second gate electrode film 44 is approximately 30 nm thick.

The nonvolatile memory region in FIG. 5C is covered with a mask. A control gate contact 23 is selectively opened on first gate electrode film 33 by using lithography and dry etching as shown in FIG. 5D.

A third gate electrode film 44a made of polycrystalline silicon film or an amorphous silicon film is formed on silicon substrate 30 by using CVD as shown in FIGS. 5C and 5D. Third gate electrode film 44a is approximately 30 nm thick. During this process an ultra-thin silicon oxide film 44b is formed on second gate electrode film 44. Ultra-thin silicon oxide film 44b may be about 3 nm in maximum thickness and below 1 nm in minimum thickness.

Conductive impurities are introduced into third gate electrode film 44a and second gate electrode film 44 by using ion implantation. Third gate electrode film 44a, second gate electrode film 44, second gate insulating film 34 and first gate electrode film 33 is selectively patterned by using lithography and dry etching as shown in FIGS. 5E and 5F.

In the CMOS logic circuit region (not illustrated), third gate electrode film 44a and second gate electrode film 44 also selectively patterned during the same processes. As a result, the gate structure is formed in the nonvolatile memory region and the CMOS logic circuit region.

As the further process steps are the same as those of the first embodiment, the steps maybe simply explained.

Conductive impurities are introduced into silicon substrate 30 by using ion implantation as shown in FIG. 5G. Third gate electrode film 44a and second gate electrode film 44 are used as a mask. A source and a drain region with a comparatively shallow junction depth (not illustrated) are formed. Boron such as a p-type impurity is implanted with a dose of 1E15 cm$^{-2}$ to 1E16 cm$^{-2}$. Phosphorus or arsenic such as an n-type impurity is implanted with a dose of 1E13 cm$^{-2}$ to 1E14 cm$^{-2}$.

An insulating film such as a silicon nitride is formed on second gate electrode film 44 by using CVD. The surface region of the insulating film is removed by using dry etching. As a result, a sidewall insulating film 45 is selectively formed on a side surface of the layered structure as shown in FIGS. 5G and 5H.

Conductive impurities are introduced into silicon substrate 30 by using ion implantation; using third gate electrode film 44a, second gate electrode film 44 and sidewall insulating film 45 as a mask. A source and a drain region with a comparatively deep junction depth are formed. Boron such as a p-type impurity is implanted with a dose of 1E15 cm$^{-2}$ to 1E16 cm$^{-2}$. Phosphorus or arsenic such as an n-type impurity is implanted with a dose of 1E15 cm$^{-2}$ to 1E16 cm$^{-2}$.

Source and drain region 46 including also the comparatively shallow source and drain described previously, is finally formed as shown in FIG. 5G.

A Co-film is formed on silicon substrate 30. A cap film, such as Ti or TiN, maybe further formed on the Co-film, as required. By subsequent thermal annealing, Co-salicide electrode film 48 is formed on second gate electrode film 44 and source and drain 46 as shown in FIGS. 5G and 5H. The same fabrication steps proceeded in the CMOS logic circuit region and the transistor is formed in the CMOS logic circuit region.

A silicon oxide film (not illustrated) is formed on silicon substrate 30 by using plasma-assisted CVD. Contact holes are opened in the silicon oxide film. A metal interconnection including a bit line is formed. Furthermore, the formation of the silicon oxide, the contact holes, and the metal interconnection are carried out, as required. A multilevel interconnection can be formed.

The surface of silicon substrate 30 is covered with a protective insulating film. Pad portions may be opened to finish a semiconductor device including the nonvolatile memory.

According to the embodiment, both the gate electrode film of the CMOS logic circuit and the control gate electrode film of nonvolatile memory comprised with second gate electrode film 42 are formed at a relatively later step in the fabrication. Therefore, subsequent thermal processes are avoided and the gate structure is suitable for miniaturization of the transistor of the CMOS logic circuit. The performance of the CMOS logic circuit in the semiconductor device including the nonvolatile memory can improve.

Moreover, the semiconductor device including the nonvolatile memory can advance operation speed of the CMOS logic circuit by using three kinds of transistors each having different film thickness of the gate insulating film corresponding to the supply voltage.

The break-down gate voltage of the transistor in the nonvolatile memory cell can be increased by making film thickness of the second gate insulating film of the memory cell thicker than the gate insulating film of the medium film thickness in the CMOS logic circuit. The operation speed of the nonvolatile memory cell can be increased by making the second gate insulating film of the memory cell thinner than the gate insulating film of the maximum film thickness in the CMOS logic circuit.

The semiconductor device including the nonvolatile memory with the two superior characteristics mentioned above is obtained.

As the third gate electrode film connect to the first gate electrode film in the nonvolatile memory, the select gate in the select transistor is easily connected to upper metal interconnections.

The third embodiment of present invention is hereinafter explained

Figure 6:
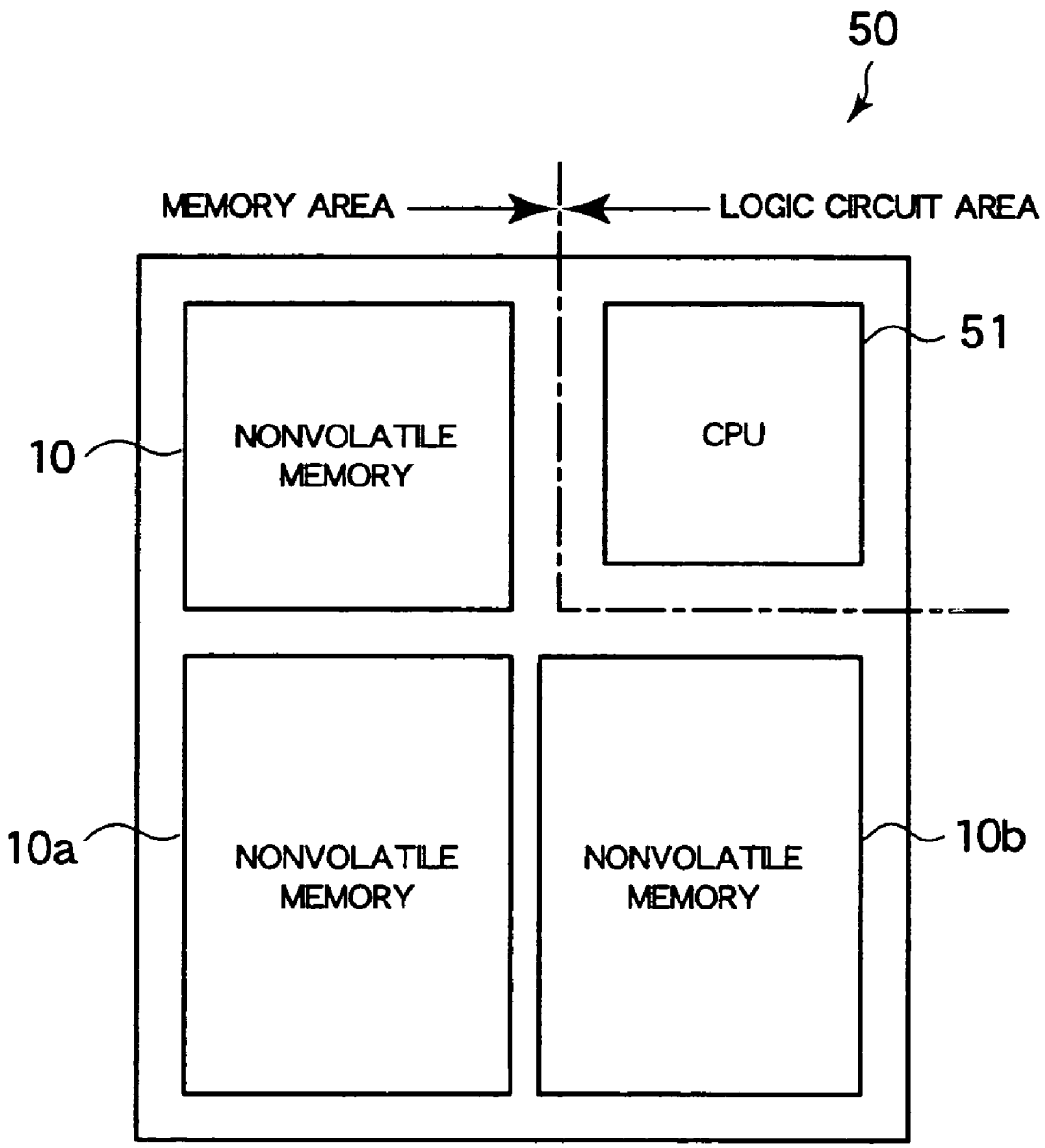
FIG. 6 is a block diagram showing a system LSI in a third embodiment of the present invention.

FIG. 6 shows a block diagram of a system LSI in the third embodiment of the present invention. The third embodiment is a system LSI including a plurality of nonvolatile memory circuits.

The system LSI 50 has a logic circuit area 50a and a memory area 50b. For example, CPU 51 is formed in logic circuit area 50a. Three kinds of nonvolatile memories are formed in memory area 50b. Three kinds of nonvolatile memories are nonvolatile memory 10 having a memory cell unit formed from two transistors explained in the first embodiment and the second embodiment above-mentioned, NAND-type nonvolatile memory 10a and nonvolatile memory 10b having a memory cell unit formed of the three transistors.

In system LSI 50, nonvolatile memory 10 having a memory cell unit formed of two transistors and CPU 51 are included in the same chip, so nonvolatile memory 10 can be used as a read-only memory, which stores the firmware of CPU 51.

Figure 7:
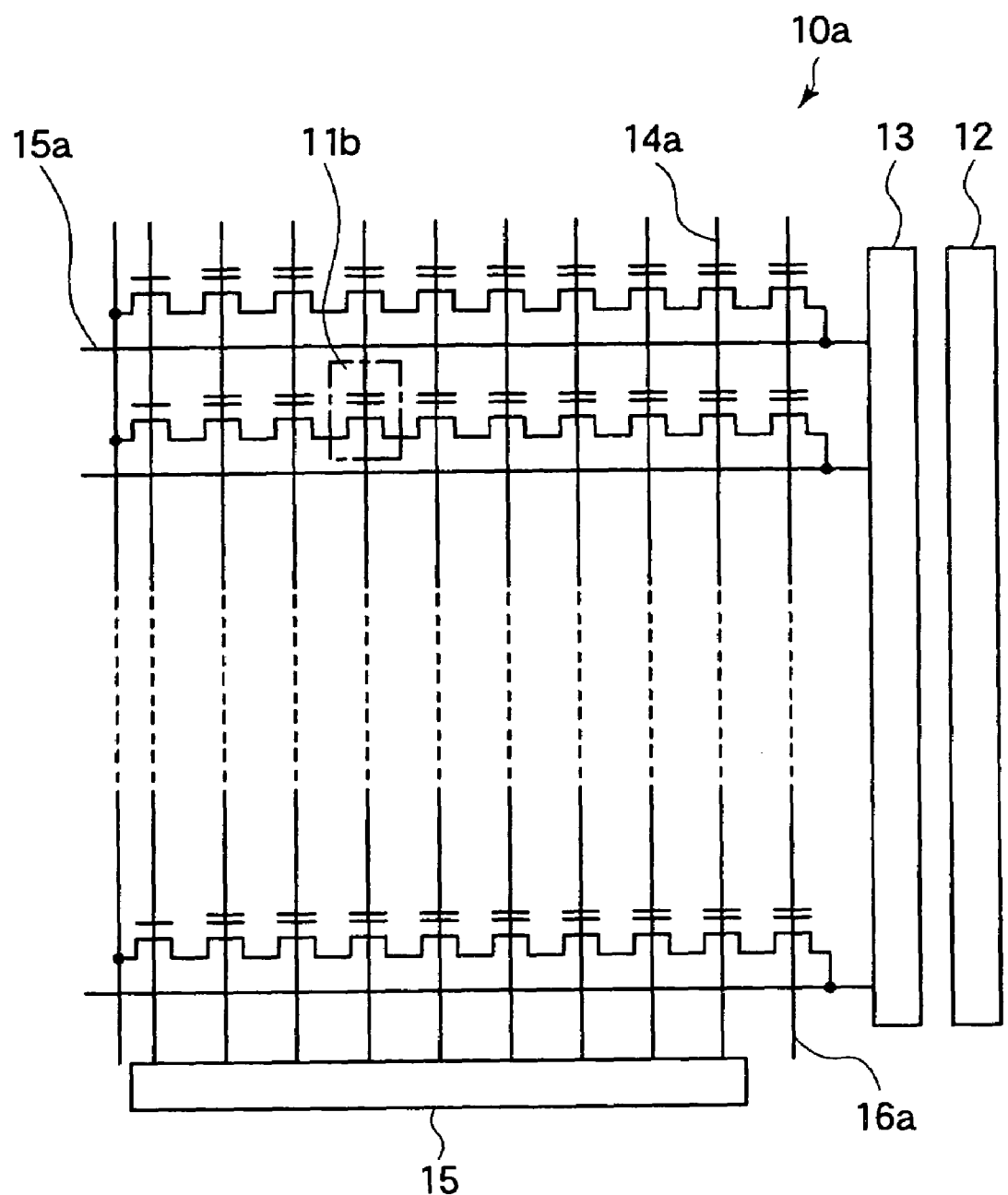
FIG. 7 is a circuit block diagram showing a nonvolatile memory included in the system LSI in the third embodiment of the present invention.

The circuit block diagram of NAND-type nonvolatile memory 10a in system LSI 50 is shown in FIG. 7. Memory cell lib is formed of one transistor having a layered gate structure. Column decoder 12, sense amplifier 13 and low decoder 14 are formed in the periphery area.

Figure 8:
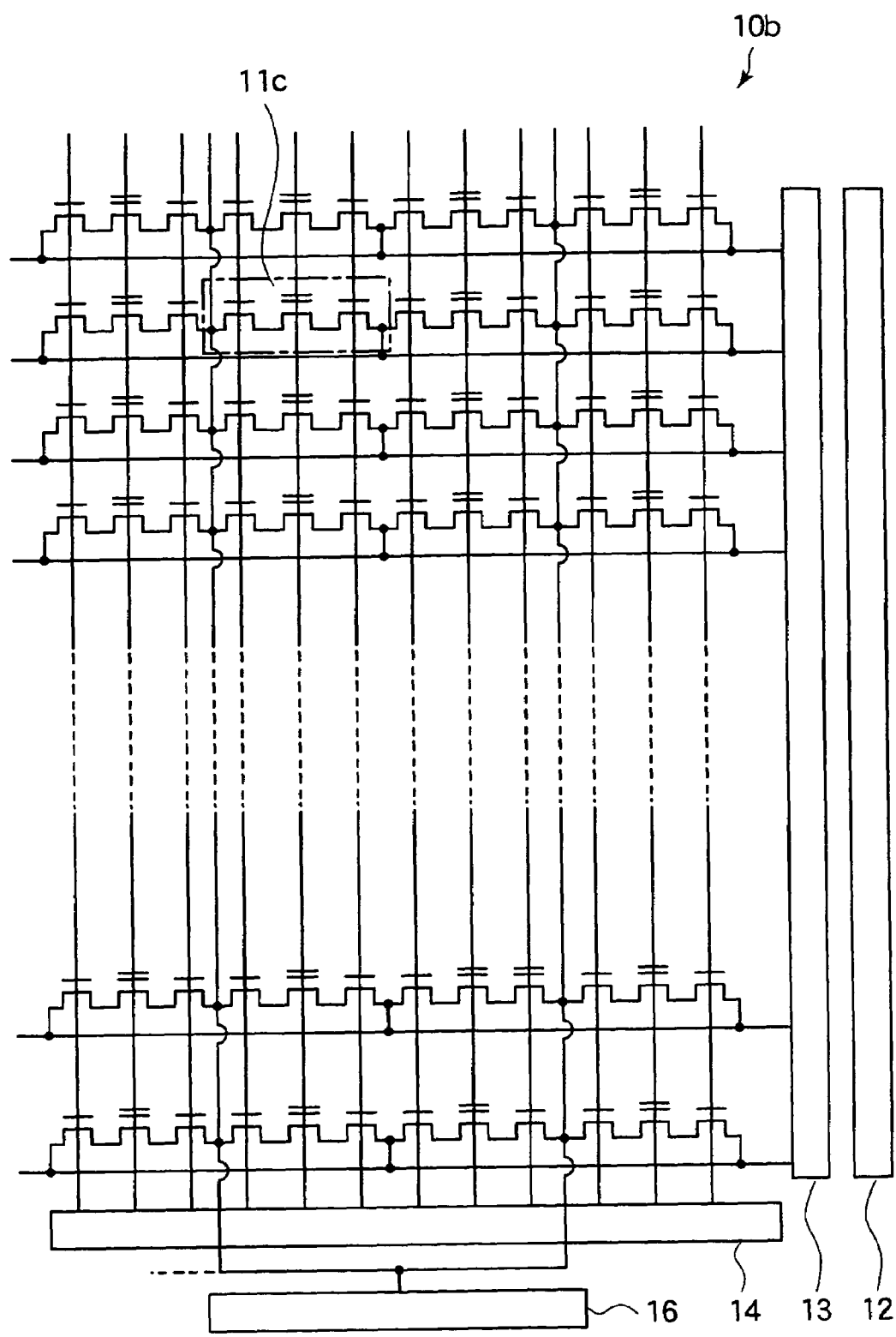
FIG. 8 is a circuit block diagram showing a nonvolatile memory included in the system LSI in the third embodiment of the present invention.

The circuit block diagram of nonvolatile memory 10b having a memory cell unit formed of the three transistors in system LSI 50 is shown in FIG. 8. Memory cell 11c is formed of one memory cell transistor having a layered gate structure and two select transistors sandwiched the memory cell transistor. Column decoder 12, sense amplifier 13, low decoder 14 and source line driver 16 are formed in the periphery area.

A fabrication method of system LSI 50 is fundamentally the same as that of the semiconductor device described with the first embodiment, and consequently, system LSI 50 can be fabricated easily for a semiconductor device.

The nonvolatile memory 10 having a memory cell unit formed of the two transistors, NAND-type nonvolatile memory 10a and nonvolatile memory 10b having a memory cell unit formed of the three transistors can be fabricated by the same processes and the same conditions, which leads to simplify the fabrication steps of a system LSI 50.

Moreover, it is also possible to apply the above-mentioned fabrication method to a semiconductor device, which contains independently NAND-type nonvolatile memory 10a or nonvolatile memory.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the first gate insulating film, the second gate insulating film and the third gate insulating film are not only the silicon oxide film and the silicon nitride film but also silicon oxy-nitride film which contains both oxygen and nitrogen by various composition or metal oxide film such as a hafnium oxide film, a zirconium oxide film, a titanium oxide film, an aluminum oxide film, the compound film of those oxide films and a layered film of those oxide films.

Furthermore, by using the high concentration n-type silicon as a gate electrode material including the first gate electrode film and the second gate electrode film, applications as semiconductor devices may be performed comparatively easily.

Moreover, a material of the salicide film formed on the gate electrode and the source and drain region is not Co but Ti, Ni, W, Ta and Mo, etc. The gate electrode film of layered structure including the silicide of the above-mentioned metal or the nitride of that can also be formed.

Metal interconnection can be chosen from Al, Cu, Au, Ag, and W, etc. Moreover, underlying barrier metal beneath the metal interconnection may lead to an advantage, such as adhesion with an insulating layer and reaction suppression in a contact area. In this case, a metal such as W, Mo, Ti, etc., a metal silicide such as W-silicide, Mo-silicide, Ti-silicide, etc. and a metal nitride such as W-nitride, Mo-nitride, Ti-nitride, etc. may be formed or layered structure.

As p-type silicon substrate 30 is used in the embodiments, a p-type well need not be formed in the nonvolatile memory area. As required, a p-type well is formed in the nonvolatile memory area by using ion-implantation. In this case, the well may be a double well structure having a p-type well within an n-type well.

In addition to a silicon substrate, compound semiconductor substrates such as a SOI substrate and GaAs substrate etc. can be used as a semiconductor substrate.

The layered structure can be applied not to the nonvolatile memory but to other kinds of semiconductor devices. Moreover, the nonvolatile memory can be applied to both solo nonvolatile memory and a semiconductor device mixed with various logic circuits.

What is claimed is:

1. A semiconductor device, comprising:
a semiconductor substrate;
a nonvolatile memory cell including a first MOS transistor having a first gate formed on the semiconductor substrate, the first gate being a layered gate structure having a first gate insulating film, a first gate electrode film, a second gate insulating film, a second gate electrode film, an ultra-thin insulating film having a thickness of less than approximately 3 nm, and a third gate electrode film, and a source and a drain formed in the substrate to interpose a surface region of the semiconductor substrate beneath the first gate; and
a logic circuit including a plurality of second MOS transistors having a second gate formed on the semiconductor substrate, the second gate being a gate structure having a third gate insulating film, the second gate electrode film, the ultra-thin insulating film having a thickness of less than approximately 3 nm, and the third gate electrode film, and the source and the drain formed in the semiconductor substrate to interpose the surface region of the semiconductor substrate beneath the second gate.

2. A semiconductor device according to claim 1, wherein an opening is formed in the second gate insulating film and the second gate electrode film, and the third gate electrode film is connected to the first gate electrode film at the opening.

3. A semiconductor device according to claim 1, further comprising a metal-silicide film formed on the third gate electrode film, and the source and the drain.

4. A semiconductor device according to claim 1, wherein the logic circuit is a CMOS logic circuit.

5. A semiconductor device according to claim 1, wherein the nonvolatile memory cell includes a memory cell transistor and a select transistor for the first MOS transistor, a terminal of the memory cell transistor being connected to the select transistor.

6. A semiconductor device according to claim 1, wherein an opening is formed in the second gate insulating film and the second gate electrode film on the first gate electrode film, and the third gate electrode film is connected to the first gate electrode film at the opening.

7. A semiconductor device according to claim 1, wherein the plurality of second MOS transistors includes at least one second MOS transistor having the third gate insulating film of a first thickness, the second MOS transistor having the third gate insulating film of a second thickness and the second MOS transistor having the third gate insulating film of a third thickness.

8. A semiconductor device according to claim 7, wherein the first thickness is thicker than the second thickness and the second thickness is thicker than the third thickness.

9. A semiconductor device according to claim 7, wherein each of the first thickness, the second thickness, and the third thickness has a different value.

* * * * *